US008929502B2

(12) United States Patent
Endo et al.

(10) Patent No.: US 8,929,502 B2
(45) Date of Patent: Jan. 6, 2015

(54) HIGH-FREQUENCY SIGNAL PROCESSING DEVICE AND WIRELESS COMMUNICATION SYSTEM

(75) Inventors: Ryo Endo, Kanagawa (JP); Keisuke Ueda, Kanagawa (JP); Toshiya Uozumi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 313 days.

(21) Appl. No.: 13/560,639

(22) Filed: Jul. 27, 2012

(65) Prior Publication Data

US 2013/0051290 A1 Feb. 28, 2013

(30) Foreign Application Priority Data

Aug. 31, 2011 (JP) ................. 2011-188835

(51) Int. Cl.
*H03D 3/24* (2006.01)
*H03L 7/06* (2006.01)
*H04L 27/00* (2006.01)
*H03K 23/66* (2006.01)

(52) U.S. Cl.
CPC .......... *H03K 23/662* (2013.01); *H04L 27/0014* (2013.01); *H04L 2027/0036* (2013.01); *H04L 2027/0022* (2013.01); *H04L 2027/0055* (2013.01); *H04L 2027/0087* (2013.01); *H04L 2027/0016* (2013.01); *H04L 2027/0067* (2013.01); *H04L 2027/0069* (2013.01)
USPC .............................. 375/376; 327/159; 331/25

(58) Field of Classification Search
CPC ..... H03L 7/099; H03L 7/087; H03L 2207/06; H03L 7/18; H03L 2207/50; H03L 7/0991; H03L 7/08; H03L 7/113; H03L 7/06; H03L 7/1976; H03L 7/033; H03L 2027/0016; H03L 2027/0067
USPC ........ 375/376; 327/150, 159; 331/1 R, 25, 34
See application file for complete search history.

(56) References Cited

U.S. PATENT DOCUMENTS

| 2002/0041216 A1* | 4/2002 | Welland et al. ........... 331/117 R |
| 2006/0050821 A1* | 3/2006 | Ajjikuttira et al. ............ 375/354 |
| 2010/0267352 A1* | 10/2010 | Fujii et al. ..................... 455/255 |
| 2012/0068745 A1* | 3/2012 | Hsieh et al. .................... 327/157 |

FOREIGN PATENT DOCUMENTS

| EP | 1 813 030 B1 | 1/2012 |
| JP | 2008-521280 A | 6/2008 |

* cited by examiner

*Primary Examiner* — Don N Vo
(74) *Attorney, Agent, or Firm* — Foley & Lardner LLP

(57) ABSTRACT

To reduce the influence of a spurious in a high-frequency signal processing device and a wireless communication system each provided with a digital type PLL circuit. In a digital type PLL circuit including a digital phase comparator unit, a digital low-pass filter, a digital control oscillator unit, and a multi-module driver unit (frequency divider unit), the clock frequency of a clock signal in the digital phase comparator unit is configured selectably among a plurality of options. The clock frequency is selected among frequencies which are integer multiples of a reference frequency, in accordance with which frequency band of a standard is to be set for an oscillation output signal of the digital control oscillator unit.

18 Claims, 16 Drawing Sheets

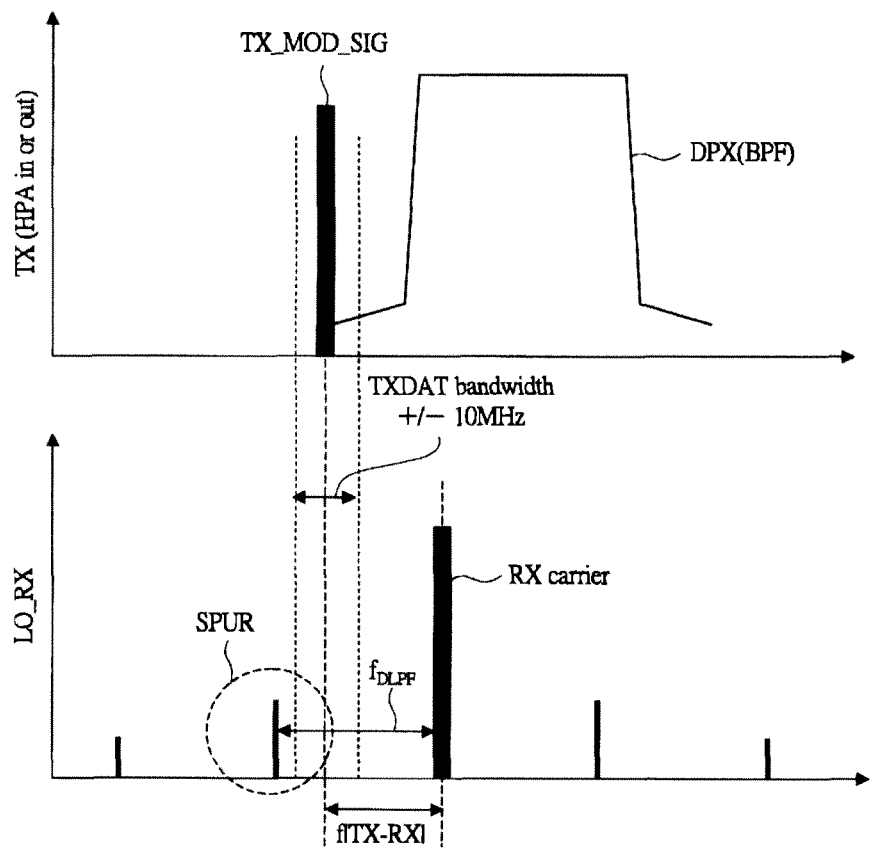

FIG. 8

| BAND | TRANSMISSION FREQUENCY BAND TX(MHz) | RECEIVING FREQUENCY BAND RX(MHz) | fTX-RX(MHz) | TRANSMISSION-RECEIVING SEPARATION METHOD |
|---|---|---|---|---|
| 1 | 1920~1980 | 2110~2170 | 190 | FDD |
| 2 | 1850~1910 | 1930~1990 | 80 | |
| 3 | 1710~1785 | 1805~1880 | 95 | |
| 4 | 1710~1755 | 2110~2155 | 400 | |
| 5 | 824~849 | 869~894 | 45 | |
| 6 | 830~840 | 875~885 | 45 | |
| 7 | 2500~2570 | 2620~2690 | 120 | |
| 8 | 880~915 | 925~960 | 45 | |
| 9 | 1749.9~1784.9 | 1844.9~1879.9 | 95 | |
| 10 | 1710~1770 | 2110~2170 | 400 | |
| 11 | 1427.9~1447.9 | 1475.9~1495.9 | 48 | |
| 12 | 698~716 | 728~746 | 30 | |
| 13 | 777~787 | 746~756 | 31 | |
| 17 | 704~716 | 734~746 | 30 | |
| 18 | 815~830 | 860~875 | 45 | |
| 19 | 830~845 | 875~890 | 45 | |
| 20 | 832~862 | 791~821 | 41 | |
| 21 | 1447.9~1462.9 | 1495.9~1510.9 | 48 | |
| 38 | 2570~2620 | 2570~2620 | - | TDD |
| 40 | 2300~2400 | 2300~2400 | - | |
| GSM850 | 824~849 | 869~894 | 45 | |
| GSM900 | 880~915 | 925~960 | 45 | |
| DCS1800 | 1710~1785 | 1805~1880 | 95 | |
| PCS1900 | 1850~1910 | 1930~1990 | 80 | |

FIG. 9A
DPLL_TX

| Band | RFdco min | RFdco max | Divider Ratio | DLPF Clock |
|---|---|---|---|---|
| 1 | 3840.0 | 3960.0 | 1/2 | 78.0 |
| 2 | 3700.0 | 3820.0 | 1/2 | 52.0 |
| 3 | 3420.0 | 3570.0 | 1/2 | 78.0 |
| 4 | 3420.0 | 3510.0 | 1/2 | 52.0 |
| 5 | 3296.0 | 3396.0 | 1/4 | 78.0 |
| 6 | 3320.0 | 3360.0 | 1/4 | 78.0 |
| 7 | 5000.0 | 5140.0 | 1/2 | 52.0 |
| 8 | 3520.0 | 3660.0 | 1/4 | 78.0 |
| 9 | 3499.8 | 3569.8 | 1/2 | 78.0 |
| 10 | 3420.0 | 3540.0 | 1/2 | 78.0 |
| 11 | 5711.6 | 5811.6 | 1/8 | 52.0 |
| 12 | 5584.0 | 5728.0 | 1/5 | 52.0 |
| 13 | 3885.0 | 3935.0 | 1/8 | 52.0 |
| 17 | 5632.0 | 5728.0 | 1/8 | 52.0 |
| 18 | 3260.0 | 3320.0 | 1/4 | 78.0 |
| 19 | 3320.0 | 3380.0 | 1/4 | 78.0 |
| 20 | 3328.0 | 3448.0 | 1/4 | 78.0 |
| 21 | 5791.6 | 5851.6 | 1/4 | 78.0 |
| 38 | 5140.0 | 5240.0 | 1/2 | 52.0 |
| 40 | 3450.0 | 3600.0 | 2/3 | 52.0 |

FIG. 9B
DPLL_RX

| Band | RFdco min | RFdco max | Divider Ratio | DLPF Clock |
|---|---|---|---|---|
| 1 | 4220.0 | 4340.0 | 1/2 | 78.0 |
| 2 | 3860.0 | 3980.0 | 1/2 | 52.0 |
| 3 | 3610.0 | 3760.0 | 1/2 | 78.0 |
| 4 | 4220.0 | 4310.0 | 1/2 | 52.0 |
| 5 | 3476.0 | 3576.0 | 1/4 | 78.0 |
| 6 | 3500.0 | 3540.0 | 1/4 | 78.0 |
| 7 | 3930.0 | 4035.0 | 2/3 | 52.0 |
| 8 | 3700.0 | 3840.0 | 1/4 | 78.0 |
| 9 | 3689.8 | 3759.8 | 1/2 | 78.0 |
| 10 | 4220.0 | 4340.0 | 1/2 | 78.0 |
| 11 | 3689.8 | 3752.3 | 2/5 | 52.0 |
| 12 | 3640.0 | 3730.0 | 1/5 | 52.0 |
| 13 | 3730.0 | 3780.0 | 1/5 | 52.0 |
| 17 | 3670.0 | 3730.0 | 1/5 | 52.0 |
| 18 | 3440.0 | 3500.0 | 1/4 | 78.0 |
| 19 | 3500.0 | 3560.0 | 1/4 | 78.0 |
| 20 | 3955.0 | 4105.0 | 1/5 | 78.0 |
| 21 | 3739.8 | 3777.3 | 2/5 | 78.0 |
| 38 | 3855.0 | 3930.0 | 2/3 | 52.0 |
| 40 | 3450.0 | 3600.0 | 2/3 | 52.0 |

HIGH-FREQUENCY SIGNAL PROCESSING DEVICE AND WIRELESS COMMUNICATION SYSTEM

CROSS-REFERENCE TO RELATED APPLICATION

The disclosure of Japanese Patent Application No. 2011-188835 filed on Aug. 31, 2011 including the specification, drawings and abstract is incorporated herein by reference in its entirety.

BACKGROUND

The present invention relates to a high-frequency signal processing device and a wireless communication system, and particularly relates to a technique which is effectively applied to a high-frequency signal processing device for a mobile phone system, mounting a digital type PLL (Phase Locked Loop) circuit.

Japanese Patent Laid-Open (Translation of PCT Application) No. 2008-521280 (Patent document 1) discloses a transmission leakage signal removal adaptive filter for mitigating the influence of a transmission leakage signal from a transmission system circuit to a receiving system circuit. When the receiving system circuit receives a receiving signal including a desired signal and jammer and a transmission leakage signal, noise is caused in the desired signal by mixing modulation of the jammer and the 4830-8692-5584.1 transmission leakage signal. The above adaptive filter subtracts subtraction of an estimation value of this transmission leakage signal from the receiving signal in the receiving system circuit.

SUMMARY

A wireless transmission system represented by a mobile phone includes, when divided broadly, a baseband processing unit performing baseband signal (digital signal) processing, a high-frequency signal processing unit performing frequency conversion between the baseband signal and a high-frequency signal, and the like. Since, unlike the baseband processing unit, the high-frequency signal processing unit normally includes many analog circuits, the baseband processing unit and the high-frequency signal processing unit are often realized by respective individual semiconductor chips. A typical example of an analog circuit within the high-frequency signal processing unit is a PLL circuit generating a high-frequency signal.

Recently, a digital type PLL circuit including a digital circuit has been gathering attention as an alternative technique to this analog type PLL circuit. The digital type PLL circuit is also referred to as an ADPLL (All Digital Phase Locked Loop). When the digital type PLL circuit is used, the benefit of the miniaturization technique of the CMOS (Complementary Metal Oxide Semiconductor) process can be received. Thus, along with the progress, it is possible to realize a smaller area, a lower power source voltage, a higher performance (higher speed), and the like. Furthermore, it can be expected that the baseband processing unit and the high-frequency signal processing unit are realized by the same semiconductor chip and further downsizing in a wireless communication system is realized.

Furthermore, in a wireless transmission system such as the mobile phone, generally it is a common subject to solve a problem caused by a spurious (unnecessary signal) (so-called spurious countermeasures). When a digital type PLL circuit as described above is applied to the high-frequency signal processing unit, the study of the present inventors has found that the spurious problem can be caused in the following case. FIG. 15 is an explanatory diagram showing a mechanism of causing the spurious problem in a wireless communication system which has been examined as the premise of the present invention. FIG. 16 is an explanatory diagram showing a mechanism different from that of FIG. 15.

FIG. 15 schematically shows a part of a transmission-receiving system circuit to be mounted on the mobile phone or the like. In FIG. 15, for transmission, a transmission mixer circuit MIX_TX performs up-conversion (frequency conversion) and modulation of a transmission analog baseband signal TXDAT (0 to 20 MHz or the like) into a high frequency band, and a power amplifier circuit HPA amplifies the modulation signal and outputs a transmission power signal TX. At this time, MIX_TX performs the up-conversion through the use of a transmission local signal which is generated by a transmission digital type PLL circuit DPLL_TX and has a frequency of 2 GHz band or the like, (local oscillation signal or carrier signal) LO_TX. Furthermore, TX output by HPA is transmitted from an antenna ANT via a duplexer DPX separating a transmission frequency band and a receiving frequency band (realized by a band-pass filter BPF or the like).

Meanwhile, for receiving, a signal received by ANT is input into a receiving mixer circuit MIX_RX via DPX as a receiving power signal RX, and MIX_RX performs down-conversion (frequency conversion) and demodulation of this RX (2 GHz band or the like) into an analog baseband signal RXDAT (0 to 20 MHz or the like). At this time, MIX_RX performs the down-conversion using a receiving local signal which is generated by a receiving digital type PLL circuit DPLL_RX and has a frequency of 2 GHz band or the like (local oscillation signal or carrier signal) LO_RX. RXDAT, after an unnecessary frequency component having been removed via a low-pass filter LPF, is converted into a digital baseband signal via an analog-digital converter circuit ADC.

In such a configuration, the transmission digital type PLL circuit DPLL_TX, while details are omitted, is provided with a digital low-pass filter DLPF corresponding to a loop filter in a conventional analog type PLL circuit. DLPF operates in synchronization with a clock signal (clock frequency $f_{DLPF}$), and thus, in addition to a predetermined transmission carrier frequency component, a frequency component associated with the clock signal can be superimposed on the transmission local signal LO_TX. Then, as shown in FIG. 15, the transmission local signal LO_TX includes, in addition to a desired wave (transmission modulation signal TX_MOD_SIG) having a predetermined signal band centering a predetermined transmission carrier frequency in accordance with the data amount of TXDAT, a spurious SPUR generated at a position apart from the transmission modulation signal TX_MOD_SIG by $f_{DLPF}$ (and integer multiple of the transmission modulation signal TX_MOD_SIG).

The receiving carrier frequency (setting frequency of LO_RX) of the receiving power signal RX is set at a position apart from the transmission carrier frequency (setting frequency of LO_TX) by a predetermined gap (f|TX−RX|) based on a transmission standard. Actual RX has a predetermined signal band (±10 MHz or the like) centering this receiving carrier frequency (2 GHz band or the like) in accordance with the data amount of a receiving analog baseband signal RXDAT, as shown in FIG. 15. The above transmission modulation signal TX_MOD_SIG scarcely leaks to RX, since the frequency of the signal is included in a block band of the receiving band-pass filter BPF in the duplexer DPX. However, the spurious SPUR can leak to RX, since the frequency of the spurious SPUR may be included in a pass band of above DPX (BPF). At this time, when the frequency of above SPUR overlaps the desired frequency of RX (signal band centering the receiving carrier frequency), the analog baseband signal RXDAT may not be obtained correctly.

FIG. 16 schematically shows a configuration for a part of a transmission system circuit which is the same as that in FIG. 15. In FIG. 16, differently from FIG. 15, a problem is that the transmission modulation signal TX_MOD_SIG is coupled to the receiving mixer circuit MIX_RX by coupling without via the duplexer DPX. In FIG. 16, the receiving digital type PLL circuit DPLL_RX, while details are omitted, is provided with a digital low-pass filter DLPF in the same way as in the case of DPLL_TX described in FIG. 15. Accordingly, the local signal LO_RX output from the DPLL_RX includes, in addition to a receiving carrier frequency component, a spurious SPUR generated at a position apart from the receiving carrier frequency by $f_{DLPF}$ (and integer multiple of the receiving carrier frequency), as in the case of LO_TX.

The transmission modulation signal TX_MOD_SIG has a predetermined signal band (±10 MHz or the like) centering the transmission carrier frequency (2 GHz band or the like) in accordance with the data amount of the transmission analog baseband signal TXDAT. When a spurious frequency of above LO_RX and the frequency of TX_MOD_SIG (signal band centering the transmission carrier frequency) overlap each other and also TX_MOD_SIG is coupled to the input of MIX_RX by the coupling, noise is superimposed on the band of the receiving analog baseband signal RXDAT band (0 to 20 MHz or the like) along with the operation of MIX_RX. In this case, RXDAT may not be obtained correctly based on the receiving power signal RX. Although each of the above phenomena in FIG. 15 and FIG. 16 also can affect the signal on the TX side by a similar mechanism, normally signal intensity on the RX side is considerably weak compared with signal intensity on the TX side and the RX side signal is considered to have a more serious problem.

The present invention has been made in view of such a problem. One of the objects is to reduce the influence of the spurious in a high-frequency signal processing device and a wireless communication system each provided with a digital type PLL circuit. The above and other objects and novel features of the present invention will become clear from the description of the present specification and the accompanying drawings.

Among the inventions disclosed in the present application, the outline of a typical embodiment will be explained briefly as follows.

A high-frequency signal processing device according to the present embodiment includes a digital phase comparator unit (DPFD), a digital filter unit (DLPF), a digital control oscillator unit (DCO), a frequency divider unit (MMD), and a setting unit (SDM, REG, BSCTL, and MCU). The digital phase comparator unit inputs a feedback oscillation signal (Fdiv1) and a reference oscillation signal (Fret) having a predetermined reference frequency, and detects a phase difference between the reference oscillation signal and the feedback oscillation signal, and also outputs a first digital signal representing the above phase difference. The digital filter unit performs averaging processing on the first digital signal in synchronization with a first clock signal ($CK_{DLPF}$) and outputs the processing result as a second digital signal. The digital control oscillator unit includes an inductance element (L) and plural capacitance elements (CBK) each coupled to an oscillator node and outputs a carrier oscillation signal (RFdco) at the oscillator node by selectively coupling the plural capacitance elements to the oscillator node based on frequency setting information represented by the second digital signal. The frequency divider unit outputs the feedback oscillation signal and the first clock signal by dividing the carrier oscillation signal. The setting unit selects a first clock frequency of the first clock signal from a plurality of options based on frequency band information of a standard to be used, and controls a frequency dividing ratio to be used in the frequency divider unit based on the selected first clock frequency and the carrier frequency set among frequency bands of the above standard.

In this manner, by selecting a clock frequency to be used in the digital filter unit appropriately in accordance with the frequency band of a standard to be used, it becomes possible to reduce the influence of the spurious generated by the digital filter unit on communication quality.

An effect obtained by a typical embodiment among the inventions disclosed in the present invention is briefly explained as follows; it becomes possible to reduce the influence of the spurious in a high-frequency signal processing device and a wireless communication system each provided with the digital type PLL circuit.

BRIEF DESCRIPTION OF THE DRAWINGS

FIG. 6 is a conceptual diagram representing a typical feature and effect in a high-frequency signal processing device according to an embodiment of the present invention;

FIG. 8 is an explanatory diagram showing standard information of each band the wireless communication system of FIG. 1 supports;

FIGS. 9A and 9B show a relationship among each band, an oscillation frequency band to be set for a digital type PLL circuit, and a clock frequency of a digital low-pass filter, where FIG. 9A is an explanatory diagram for a transmission digital type PLL circuit, and FIG. 9B is an explanatory diagram for a receiving digital type PLL circuit;

DETAILED DESCRIPTION

While the following embodiment will be explained, divided into plural units or embodiments, if necessary for convenience, these are not mutually unrelated except a case shown clearly in particular and one has a relationship such as a modification, details, and supplementary explanation of a part of or the whole of another one. Furthermore, in the following embodiment, when the number of elements and the like (including the number, a numerical value, an amount, a range, and the like) are referred to, the number may be not restricted to a specific number but may be greater or smaller than the specific number, except a case specified clearly in particular, a case restricted clearly to a specific number theoretically, and the like.

Furthermore, in the following embodiment, an element (including an element step) is not necessarily indispensable, except for the case where it is clearly specified in particular and where it is considered to be clearly indispensable from a theoretical point of view, etc. Similarly, in the following embodiment, when shape, positional relationship, etc. are referred to, what resembles or is similar to the shape etc. substantially shall be included, except for the case it is clearly specified in particular and where it is considered to be clearly not right from a theoretical point of view. This statement also applies to the numeric value and range described above.

Furthermore, a circuit element including each functional block in the embodiment is not limited in particular, but it is formed over a semiconductor substrate such as a single crystal silicon by a publicly known integrated circuit technique of a CMOS (Complementary MOS transistor) and the like. Although, in the embodiment, a MOSFET (Metal Oxide Semiconductor Field Effect Transistor) (abbreviated as MOS transistor) is used as a MISFET (Metal Insulator Semiconductor Field Effect transistor), a non-oxide film is not excluded as a gate insulating film.

Hereinafter, an embodiment of the present invention will be explained in detail in accordance with the drawings. In all the drawings for explaining the embodiment, the same symbol is attached to the same member, as a principal, and the repeated explanation is omitted.

Figure 1:
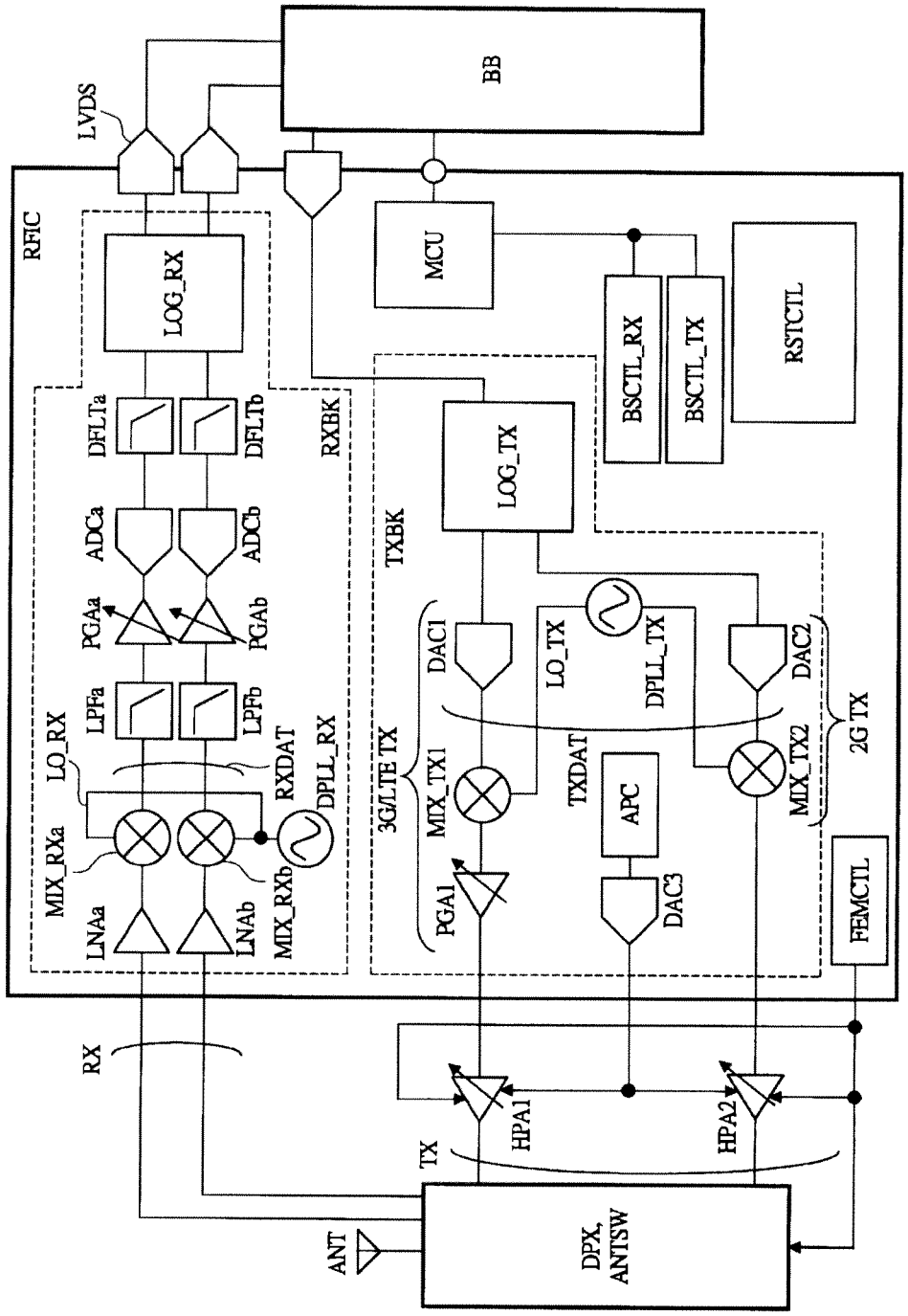
FIG. 1 is a block diagram showing an outline configuration of a wireless communication system according to an embodiment of the present invention.

<<Entire Configuration and Operation of a Wireless Communication System>>FIG. 1 is a block diagram of an outline configuration of a wireless communication system according to an embodiment of the present invention. The wireless communication system shown in FIG. 1 is a mobile phone system and includes a baseband processing device BB, a high-frequency signal processing device RFIC, power amplifier circuits HPA1 and HPA2, a duplexer DPX and antenna switch ANTSW, an antenna ANT, and the like. While not limited in particular, BB and RFIC are realized by respective individual semiconductor chips formed by the CMOS manufacturing process, and HPA1, HPA2, DPX, ANTSW are realized by plural components appropriately mounted over one module wiring substrate (typically, ceramic substrate) or the like.

The high-frequency signal processing device RFIC is provided with a transmission circuit block TXBK, a receiving circuit block RXBK, and a control unit common to transmission and reception. The control unit includes a microcomputer unit MCU, a transmission bus control unit BSCTL_TX, a receiving bus control unit BSCTL_RX, a reset control unit RSTCTL, and a frontend control unit FEMCTL. MCU includes a central arithmetic processing circuit (processor unit) and a memory unit, and controls entire RFIC while appropriately performing communication with the baseband processing device BB.

BSCTL_TX is coupled to various circuits within TXBK via a bus and controls TXBK based on an instruction from MPU. BSCTL_RX is coupled to various circuits within RXBK via a bus and controls RXBK based on an instruction from MCU. RSTCTL appropriately controls power supply, operation clock supply, and the like to various circuits within RFIC in the case of having detected power-on, having received a reset instruction to RFIC from outside, or the like. FEMCTL is controlled by MCU via BSCTL_TX and BSCTL_RX, and performs control of activation or de-activation of the power amplifiers HPA1 and HPA2, control of the antenna switch, and the like.

The transmission circuit block TXBK is provided with a transmission logic circuit LOG_TX, a digital-analog converter circuits DAC1 to DAC 3, a transmission digital type PLL circuit DPLL_TX, transmission mixer circuits MIX_TX1 and MIX_TX2, a variable gain amplifier circuit PGA1, and an automatic power control circuit APC. DAC1, MIX_TX1, and PGA1 are processing circuits for W-CDMA (Wideband Code Division Multiple Access) (or HSDPA (High Speed Downlink Packet Access) which is an extension standard of W-CDMA), LTE (Long Term Evolution) or the like. DAC 2 and MIX_TX2 are processing circuits for GSM (Global System for Mobile Communications) or the like.

More than ten frequency bands defined between 700 MHz band and 2.6 GHz band, for example, are used optionally in W-CDMA (HSDPA) and LTE. A phase-amplitude modulation scheme such as QPSK (Quadrature Phase Shift Keying), HPSK (Hybrid Phase Shift Keying), and 16QAM (Quadrature Amplitude Modulation) is used in W-CDMA (HSDPA), and a phase-amplitude modulation scheme such as QPSK, 16QAM, and 64QAM, is used in LTE. In GSM, an 850-MHz band (GSM 850), a 900-MHz band (GSM 900), a 1.8-GHz band (DCS (Digital Cellular System) 1800), and a 1.9-GHz band (PCS (Personal Communication Service) 1900) are used for example. GSM 850 and GSM 900 are called GSM low bands. DCS1800 and PCS 1900 are called GSM high bands or the like. In GSM, a phase (frequency) modulation scheme such as GMSK (Gaussian filtered Minimum Shift Keying) and 8PSK is used.

The transmission logic circuit LOG_TX receives a transmission data signal (transmission baseband signal) from the baseband processing device BB via a differential interface circuit LVDS, and performs predetermined processing (e.g., 10B8B coding, generation processing of a modulation digital baseband signal (phase information and the like)). DAC 1 converts the modulation digital baseband signal from LOG_TX into an analog baseband signal TXDAT. The digital type PLL circuit DPLL_TX generates a local signal (local oscillation signal or carrier signal) LO_TX having a predetermined transmission carrier frequency. The mixer circuit MIX_TX1 performs modulation and up-conversion (frequency conversion) for TXDAT from DAC1 using the local signal LO_TX from the DPLL_TX. The variable gain amplifier circuit PGA1 amplifies the output signal from MIX_TX1 in a predetermined gain and outputs the amplified signal to the power amplifier circuit HPA1.

DAC2 converts the modulation digital baseband signal from LOG_TX into the analog baseband signal TXDAT. MIX_TX2 performs modulation and up-conversion on TXDAT from DAC2 through the use of the local signal LO_TX from DPLL_TX, and outputs the result to the power amplifier circuit HPA2. The automatic power control circuit APC performs control via DAC3 so that the output power in each of HPA1 and HPA2 is a target value. In W-CDMA (HSDPA) and LTE, a modulation scheme causing envelope variation is used unlike a constant envelope modulation scheme in the GSM mode (GMSK modulation), and thus PGA1 is provided. Furthermore, the transmission carrier frequency in DPLL_TX, the gain in PGA1, the target value of the output power in APC are set by MCU via BSCTL_TX.

The receiving circuit block RXBK is provided with low-noise amplifier circuits LNA (a and b), receiving mixer circuits MIX_RX (a and b), low-pass filters LPF (a and b), variable gain amplifier circuits PGA (a and b), analog-digital converter circuits ADC (a and b), digital filters DFLT (a and b), a receiving digital type PLL circuit DPLL_RX, and a receiving logic circuit LOG_RX. Receiving diversity configuration is used and two systems (route "a" and route "b") from the low-noise amplifier circuit to the digital filter are provided. The receiving diversity is a mechanism for increasing signal intensity by providing plural antennas and by selecting and combining inputs.

The low-noise amplifier circuit LNAa (LNAb) performs low-noise amplification for a receiving power signal RX input via a duplexer DPX and/or an antenna switch ANTSW. The digital type PLL circuit DPLL_RX generates a local signal (local oscillation signal or carrier signal) LO_RX having a predetermined receiving carrier frequency. The mixer circuit MIX_RXa (MIX_RXb) performs demodulation and down-conversion (frequency conversion) for the output from LNAa (LNAb) using the local signal LO_RX from DPLL_RX and outputs an analog baseband signal RXDAT. The low-pass filter LPFa (LPFb) eliminates an unnecessary high frequency component in RXDAT from MIX_RXa (MIX_RXb).

The variable gain amplifier circuit PGAa (PGAb) amplifies the output from the LPAa (LPAb) in a gain which is determined in consideration of an input range in the analog-digital converter circuit ADCa (ADCb). ADCa (ADCb) converts the analog signal from PGAa (PGAb) into a digital baseband signal. The digital filter DFLTa (DFLTb) performs filtering processing such as interpolation and decimation for the digital baseband signal from ADCa (ADCb). The receiving logic circuit LOG_RX performs a predetermined digital processing (8B10B decoding or the like) for the digital signal from DFLTa (DFLTb) and outputs the result to the baseband processing device BB via a differential interface circuit LVDS as a receiving data signal (receiving baseband signal). The receiving carrier frequency in DPLL_RX is set by MCU via BSCTL_RX, for example.

Each of the power amplifiers HPA1 and HPA2 is realized by an LDMOS (Laterally Diffused MOS), an HBT (Heterojunction Bipolar Transistor), or the like. HPA1 amplifies the output signal from the above variable gain amplifier circuit PGA1 in the high-frequency signal processing device RFIC and outputs the result to the duplexer DPX and/or the antenna switch ANTSW as a transmission power signal TX. HPA2 amplifies the output signal from the above transmission mixer circuit MIX_TX2 in the above RFIC and outputs the result to DPX and/or ANTSW as the transmission power signal TX.

A power detection circuit (coupler) and the like, which are not shown in the drawing, are provided in output nodes of HPA1 and HPA2, and the above automatic power control circuit APC controls the output power of the HPA1 and HPA2 by comparing the detection result of the power detection circuit with the target value from MCU. Furthermore, although one HPA1 is shown here, as a typical example for W-CDMA or the like, actually plural HPA1 are provided for corresponding to a wide frequency range such as 700-MHz band to 2.6-GHz band, and in response to this, plural MIX_TX in the RFIC and the like are also provided. This is the same for HPA2 and furthermore the same for LNAa and LNAb in the RFIC.

The duplexer DPX is realized by an SMD (Surface Mount Device) component, a wiring pattern over the module wiring substrate, or the like, and performs separation between a transmission frequency band and a receiving frequency band. The antenna switch ANTSW is realized by an MMIC (Monolithic Microwave IC) using a compound semiconductor substrate such as gallium arsenide (GAAs), an SOI (Silicon on Insulator), or the like, and appropriately controls a connection target of the antenna ANT. Normally, the coupling between ANT and the transmission power signal TX or the receiving power signal RX is performed via ANTSW in GSM which uses a TDD (Time Division Duplex) method, and is performed via DPX in W-CDMA and LTE which uses a FDD (frequency Division Duplex) method.

By applying the digital PLL circuits DPLL_TX and DPLL_RX to the high-frequency signal processing device RFIC in this manner, although it becomes easier to realize a smaller area, a lower power source voltage, a higher performance (higher speed), and the like as described above, a problem such as one in FIG. 15 or FIG. 16 occurs. Particularly in a multi-mode and multi-band wireless communication system accommodating various communication methods and various frequency bands (bands) as shown in FIG. 1, a large number of bands are used and a large circuit scale is formed over the same semiconductor chip, and thus it is necessary to consider the influence of spurious sufficiently well. When the band to be used is changed, the gap between the transmission carrier frequency and the receiving carrier frequency (|fTX−RX|) is also changed and thus the condition causing the spurious problem is changed. When the circuit scale becomes large, the possibility of causing the coupling as described in FIG. 16 can be increased. Accordingly, it is beneficial to employ a method of the present embodiment as will be explained in the following.

Figure 2:
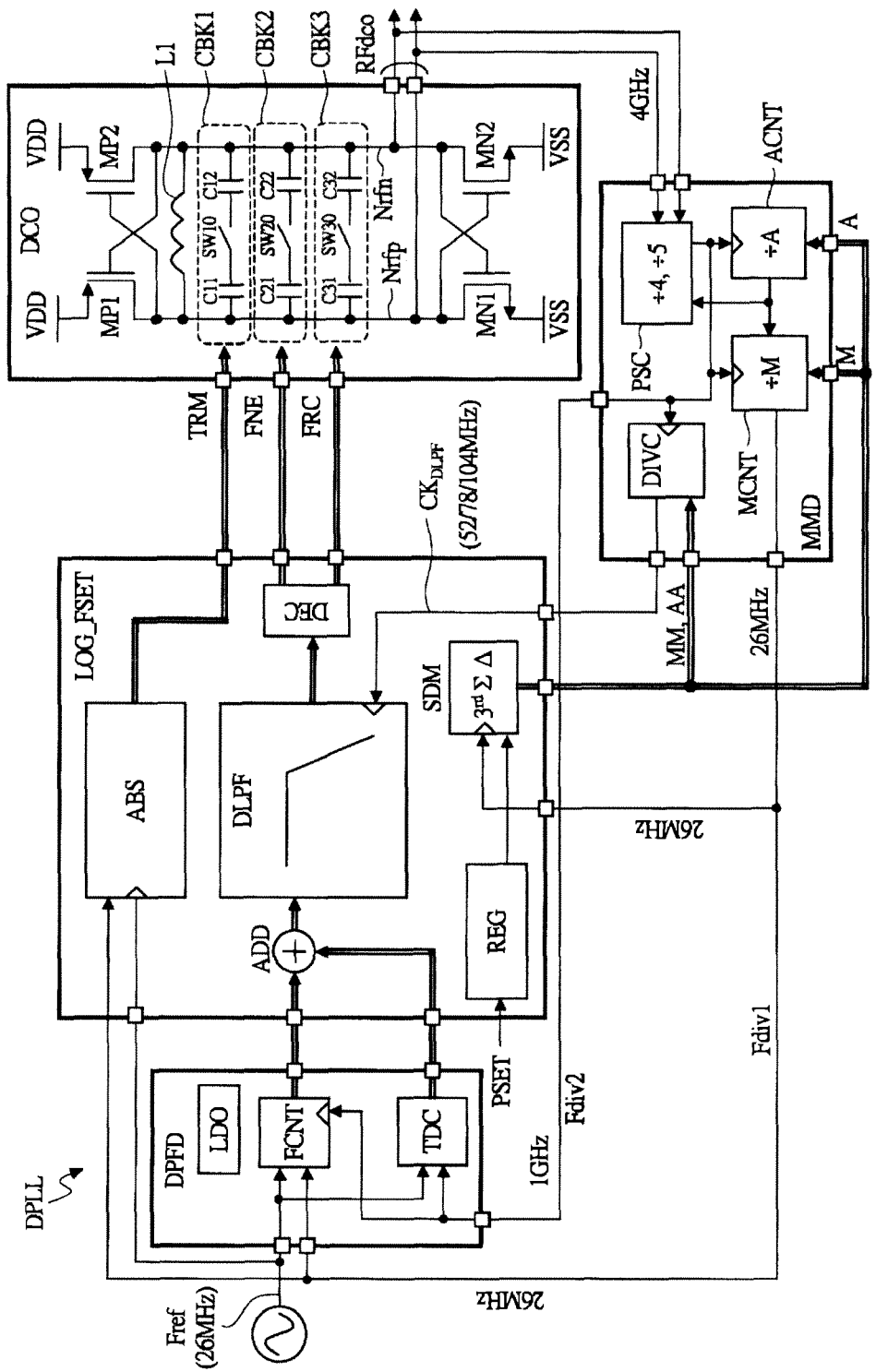
FIG. 2 is a block diagram showing a configuration of the digital type PLL circuit in the high-frequency signal processing device of FIG. 1.

<<Details of the Digital Type PLL Circuit>>FIG. 2 is a block diagram showing a configuration of a digital type PLL circuit in the high-frequency signal processing device of FIG. 1. The digital type PLL circuit DPLL shown in FIG. 2 corresponds to each of the transmission digital type PLL circuit DPLL_TX and the receiving digital type PLL circuit DPLL_RX shown in FIG. 1. DPLL of FIG. 2 is provided with a digital phase comparator unit DPFD, a frequency setting logic unit LOG_FSET, a digital control oscillator unit DCO, and a multi-module driver unit (frequency divider unit) MMD.

The digital phase comparator unit DPFD is provided with a power source regulator LDO, a frequency difference detection counter FCNT, and a time difference detection circuit TDC, and detects a phase difference between a reference oscillation signal Fref having a reference oscillation frequency (e.g., 26 MHz) generated by a quartz oscillation circuit or the like and a first frequency divider oscillation signal Fdiv1 generated by the multi-module driver unit (frequency divider unit) MDD. LDO generates a power source voltage for above DPLL. FONT counts each of Fref and Fdiv1 and detects a frequency difference between Fref and Fdiv1. In this count operation, a second frequency divider signal Fdiv2 (e.g., approximately 1 GHz) generated by MMD is used. TDC includes plural stages of unit delay circuits (CMOS inverter circuit) and detects a phase difference between Fdiv2 and Fref. Specifically, Fdiv2 is delayed sequentially by the unit delay circuit and the output from each of the unit delay circuits is latched in synchronization with Fref, and a phase difference is detected by this latch result. A higher precision of the phase comparison result can be realized, as a delay amount of the unit delay circuit can be made smaller along with a finer CMOS manufacturing process.

The frequency setting logic unit LOG_FSET is provided with an automatic band selection unit ABS, an adder ADD, a digital low-pass filter (digital loop filter) DLPF, a decoder DEC, a setting register REG, and a sigma-delta modulation unit (or digital-sigma modulation unit) SDM. ABS counts the first frequency divider oscillation signal Fdiv1 by using the reference oscillation signal Fref to detect a frequency difference between both signals and outputs a trimming signal (frequency adjustment signal) TRM having a digital code corresponding to the frequency difference. ADD combines the frequency difference detection result by the digital phase comparator unit DPFD (digital output of FCNT) and the phase difference detection result (digital output of TDC).

The digital low-pass filter DLPF performs averaging processing on the digital code output from ADD in synchronization with a third frequency divider oscillation signal (DLPF clock signal) $CK_{DLPF}$ from the multi-module driver unit (frequency divider unit) MMD. The decoder DEC decodes (code conversion) the digital code which is the processing result of the digital low-pass filter DLPF, and outputs a fine signal (frequency adjustment signal) FNE and a fractional signal (frequency adjustment signal) FRC which serves as actual frequency setting digital codes (e.g., switch on-off information).

A PLL setting signal PSET is input into the setting register REG. When this DPLL is DPLL_TX of FIG. 1, this PSET includes a setting value of the transmission carrier frequency, a setting value of the clock frequency $f_{DLPF}$ for the DLPF clock signal $CK_{DLPF}$, and the like, and this PSET is input from MCU of FIG. 1 via BSCTL_TX. In contrast, when this DPLL is DPLL_RX of FIG. 1, this PSET includes a setting value of the receiving carrier frequency, a setting value of the clock frequency $f_{DLPF}$ for $CK_{DLPF}$, and the like, and this PSET is input from MCU of FIG. 1 via BSCTL_RX. The sigma-delta modulation unit SDM appropriately controls a frequency dividing ratio of the multi-module driver unit (frequency divider unit) MMD based on the PLL setting signal PSET input in the setting register REG. Specifically, SMD generates carrier frequency dividing ratio control signals M and A for controlling the transmission carrier frequency (or receiving carrier frequency) and clock frequency dividing ratio control signals MM and AA for controlling $f_{DLPF}$, and outputs the result to MMD in synchronization with Fdiv1.

The digital control oscillator unit DCO is provided with two PMOS transistors MP1 and MP2 which are cross-coupled to each other (gate of one is coupled to the drain of the other), two NMOS transistors MN1 and MN2 which are cross-coupled to each other, a coil L1, and three-system capacitance banks CBK1 to CBK3. The sources of MP1 and NP2 are coupled to a power source voltage VDD, the sources of MN1 and MN2 are coupled to a ground power source voltage VSS, the drains of MP1 and MN1 are coupled to positive-side oscillator output node Nrpf, and the drains of MP2 and MN2 are coupled to a negative-side oscillator output node Nrfn.

L1 is coupled between Nrfp and Nrfn. CBK1 is provided with a capacitance element (e.g., MOS capacitance) C11 a first end of which is coupled to Nrfp, a capacitance element C12 a first end of which is coupled to Nrfn, and a switch SW10 which is coupled between a second end of C11 and that of C12. While one circuit set including C11, SW10, and C12 is shown representatively, actually plural sets of such circuits are provided between Nrfp and Nrfn. Then, on-off of SW10 included in each of these sets is controlled by the trimming signal TRM from the automatic band selection unit ABS. The capacitance value of the capacitance element included in each of the sets is not always the same and a weigh such as two times, four times, eight times, . . . of reference C11 (=C12), and the like may be provided appropriately.

Similarly, CBK2 is provided with a capacitance element C21 a first end of which is coupled to Nrfp, a capacitance element C22 a first end of which is coupled to Nrfn, and a switch SW20 coupled between a second end of C21 and that of C22, and plural sets of such circuits are provided between Nrfp and Nrfn. On-off of SW20 included in each of these sets is controlled by the fine signal FNE from the decoder DEC. Similarly, CBK 3 is provided with a capacitance element C31 a first end of which is coupled to NRFP, a capacitance element C32 a first end of which is coupled to Nrfn, and a switch SW30 coupled between a second end of C31 and that of C32, and plural sets of such circuits are provided between Nrfp and Nrfn. On-off of SW30 included in each of these sets is controlled by the fractional signal FRC from DEC.

Such a digital control oscillator unit DCO is an LC resonance type oscillation circuit including the coil L1 and the capacitance banks CBK1 to CBK3, and outputs complementary oscillation output signals RFdco to Nrfp and Nrfn. At this time, MP1, MP2, MN1, and MN2 function as negative resistances. The oscillation frequency of the oscillation circuit is controlled by on-off in each of the switches in CMK1 to CBK3, and the capacitance element included in the set in which the switch is controlled to be turned on contributes as a parameter determining the oscillation frequency. A relationship among the capacitance elements in CBK1 to CBK3 is C11 (=C12)>C21 (=C22)>C31 (=C32), and the oscillation frequency is adjusted separately by a unit of 2 MHz by TRM, that of 20 kHz by FNE, and that of 1.25 kHz by FRC.

The multi-module driver unit (frequency divider unit) MMD is provided with a prescaler PSC, an A counter (A frequency divider) ACNT, an M counter (M frequency divider) MCNT, and a frequency divider DIVC. PSC outputs a one-fourth frequency dividing signal or a one-fifth frequency dividing signal of the oscillation output signal RFdco as the second frequency divider oscillation signal Fdiv2 (e.g., approximately 1 GHz) in accordance with the control of ACNT. ACNT counts only the one-fifth frequency dividing signal from PCS by a count number based on the carrier frequency dividing ratio control signal A from the sigma-delta modulation unit SDM, and controls PSC so as to switch Fdiv2 to the one-fourth frequency dividing signal when the count number is reached. MCNT counts only Frdiv2 from PCS by a count number based on the carrier frequency dividing ratio control signal M from SDM, and outputs the first frequency divider oscillation signal Fdiv1.

By such a configuration, a frequency dividing ratio N of Fdiv1 to RFdco is defined by "N=M×4+A". At this time, when SDM appropriately changes the values of the carrier frequency dividing ratio control signals M and A in a temporal sequence, it becomes possible to set a frequency dividing ratio N including a decimal fraction part equivalently (in average) in addition to an integer part. When RFdco goes into a steady state, the average frequency of Fdiv1 becomes 26 MHz which is equal to Fref, and the average oscillation frequency of RFdco becomes N×26 MHz. DIVC performs frequency dividing of the second frequency divider oscillation signal Fdiv2 from the prescaler PSC in accordance with the values of the clock frequency dividing ratio control signals MM and AA from the sigma-delta modulation unit SDM, and outputs the DLPF clock signal $CK_{DLPF}$. The clock frequency $f_{DLPF}$ of $CK_{DLPF}$ is set selectively from 52 MHz, 78 MHz, and 104 MHz in accordance with the values of these MM and AA. While details are omitted, one of the major features of the present embodiment is that $f_{DLPF}$ is configured selectably in this manner.

Figure 3:
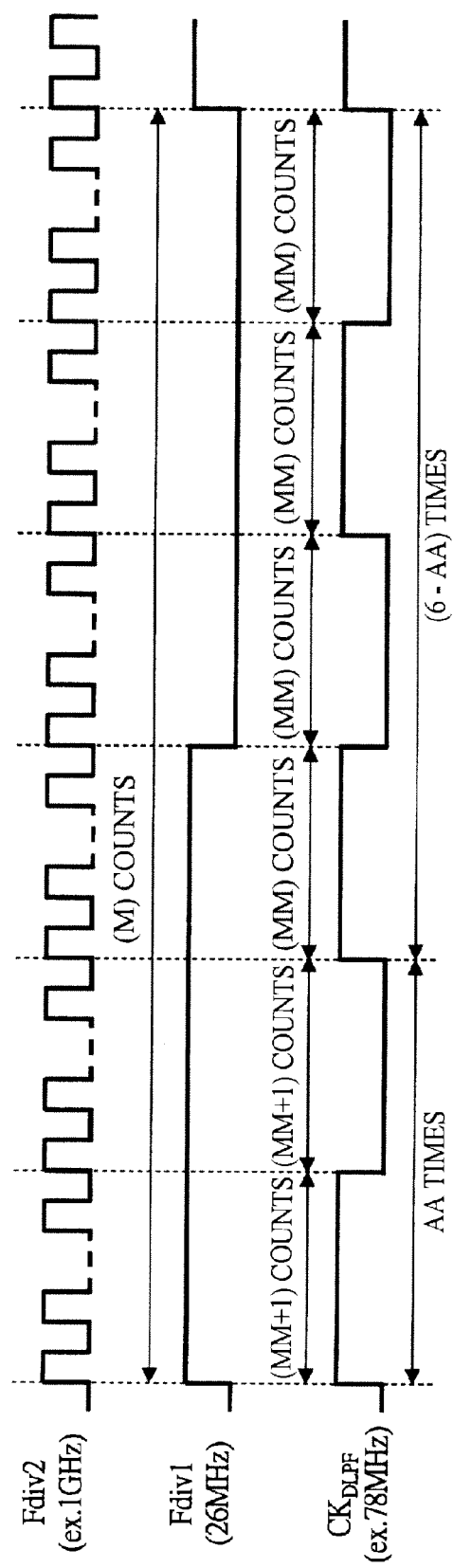
FIG. 3 is a schematic diagram showing an operation of the frequency divider unit generating a clock signal for DLPF in FIG. 2.

FIG. 3 is a schematic diagram showing an operation of the frequency divider generating the DLPF clock signal in FIG. 2. As shown in FIG. 3, when $f_{DLPF}$ is 78 MHz, the frequency divider DIVC inserts an 'H' level and an 'L' level alternately three times (total six times) into one cycle period of the first frequency divider oscillation signal Fdiv1 and generates the DLPF clock signal $CK_{DLPF}$. At this time, DIVC determines the 'H' level period and/or the 'L' level period for the first AA times of these six times by counting the second frequency divider oscillation signal Fdiv2 (MM+1) times, and determines the 'H' level period and/or the 'L' level period for the remaining (6−AA) times by counting Fdiv2 in (MM) times. This is similar in the case where $f_{DLPF}$ is 104 MHz or 52 MHz. When it is 104 MHz, the 'H' level period and the 'L' level period are inserted alternately four times (total eight times) in one cycle of Fdiv1. When it is 52 MHz, the 'H' level period and the 'L' level period are inserted alternately two times (total four times) in one cycle of Fdiv1. Then $CK_{DLPF}$ is generated.

While Fdiv1 is generated by M counts of Fdiv2, the value of this "M" is determined to be an optional value by the sigma-delta modulation unit SDM and also can be changed in a temporal sequence in some cases. $CK_{DLPF}$ is preferably synchronized with Fdiv1 and Fdiv2 (e.g., coincidence of rise edges) for synchronous operation of the digital type PLL circuit DPLL of FIG. 2, and is preferably a signal having a duty close to 50%. When a method of generating 78-MHz $CK_{DLPF}$ by simple frequency multiplication of Fdiv1 by three (specifically, method of constantly counting Fdiv2 (M/3) times or (M/6) times, or the like) is used, and the result of (M/3) (or (M/6)) has a broken number, the synchronization with Fdiv1 may not be obtained.

Accordingly, as shown in FIG. 3, also when the result of (M/3) (or (M/6)), has a broken number, it becomes possible to generate $CK_{DLPF}$ in synchronization with Fdiv1 and Fdiv2 by using a method of approximately mixing the count of Fdiv2 (MM+1) times and the count of Fdiv2 in MM times at a frequency in accordance with AA. Furthermore, an error between the 'H' level period and the 'L' level period of $CK_{DLPF}$ is included within one cycle range of Fdiv2 and thus it becomes possible to generate $CK_{DLPF}$ having a duty close to approximately 50%. The values of MM and AA can be calculated by formula (1A) when $f_{DLPF}$ is 104 MHz, by formula (2A) when $f_{DLPF}$ is 78 MHz, and by formula (3A) when $f_{DLPF}$ is 52 MHz using the value of M, respectively. This calculation is performed by the sigma-delta modulation unit SDM.

$$MM=INT(M/8), AA=M-8\times MM \quad (1A)$$

$$MM=INT(M/8+M/32+M/128+M/256), AA=M-6\times MM \quad (2A)$$

$$MM=INT(M/4), AA=M-4\times MM \quad (3A)$$

Figure 4:
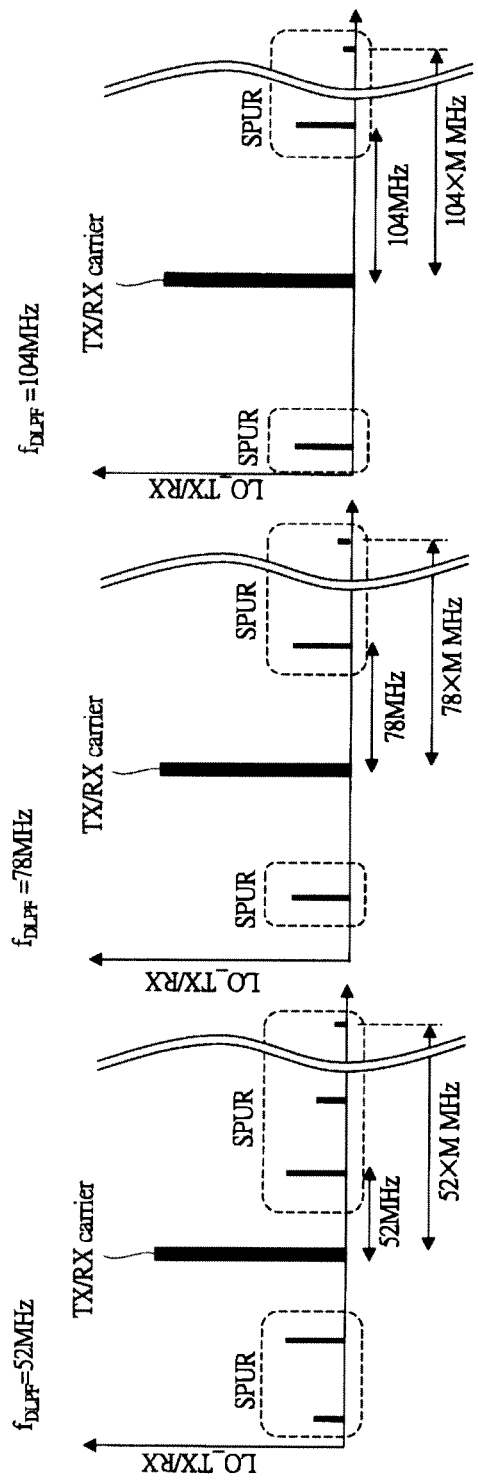
FIG. 4 is an explanatory diagram showing a spurious generation state in the digital type PLL circuit of FIG. 2.

FIG. 4 is an explanatory diagram showing a spurious generation state in the digital type PLL circuit of FIG. 2. As shown in FIG. 4, the spurious (unnecessary signal) SPUR in accordance with the clock frequency $f_{DLPF}$ of the digital type PLL circuit DPLL (DPLL_TX or DPLL_RX) can be caused in the oscillation output signal Fdco (LO_TX or LO_RX in FIG. 1) of the digital control oscillator circuit DCO of FIG. 2. When $f_{DLPF}$ is 52 MHz in DPLL_TX, the spurious (unnecessary signal) SPUR can be caused at positions centering the transmission carrier frequency apart therefrom by ±M×52 MHz (M=1, 2, 3, . . . ). Similarly, when $f_{DLPF}$ is 78 MHz, SPUR is caused at positions centering the transmission carrier frequency apart therefrom by ±M×78 MHz (M=1, 2, 3 . . . ), and, when $f_{DLPF}$ is 104 MHz, SPUR is caused at positions centering the transmission carrier frequency apart therefrom by ±M×104 MHz (M=1, 2, 3, . . . ). This is because a frequency component of $f_{DLPF}$ is caused in the output of DLPF and this is modulated by DCO.

Figure 5:
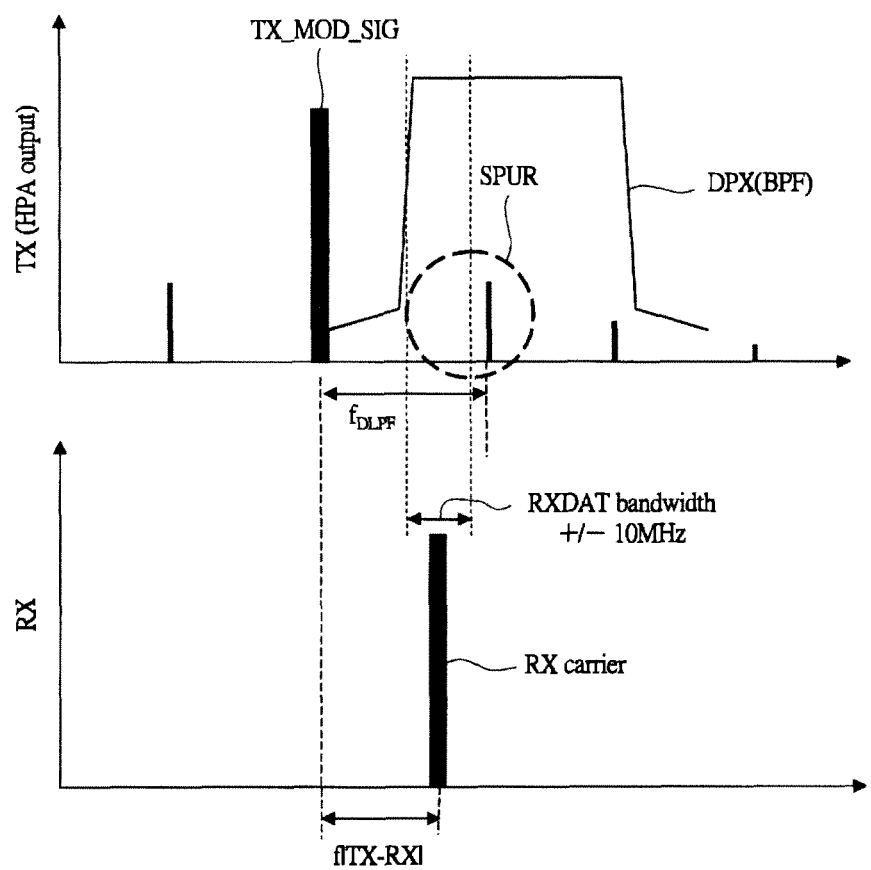
FIG. 5 is a conceptual diagram representing a typical feature and effect in a high-frequency signal processing device according to an embodiment of the present invention.

<<Typical Feature and Effect of the Present Embodiment>> FIG. 5 is a conceptual diagram showing a typical feature and effect of the high-frequency signal processing device according to an embodiment of the present invention. FIG. 5 shows a method for solving the above problem in FIG. 15. As shown in FIG. 5, in addition to the desired wave (transmission modulation signal TX_MOD_SIG) having a predetermined signal band centering a predetermined transmission carrier frequency in accordance with the data amount of TXDAT, the spurious SPUR caused at positions apart from the desired waveform by ±M×$f_{DLPF}$ (M=1, 2, 3, . . . ) is included in the transmission power signal TX to be output from FPA1 of FIG. 1. Meanwhile, the receiving carrier frequency (setting frequency of LO_RX) of the receiving power signal RX input into LNAa (LNAb) of FIG. 1 is set at a position apart from the transmission carrier frequency (setting frequency of LO_TX) by a predetermined gap (f|TX−RX|) on a basis of a communication standard. Actual RX has a predetermined signal band (e.g., ±10 MHz in LTE) centering this receiving carrier frequency in accordance with the data amount of the receiving analog baseband signal RXDAT (corresponding to the output signal of MIX_RXa (MIX_RXb) of FIG. 1).

The above transmission modulation signal TX_MOD_SIG is output to the antenna ANT via the duplexer DPX in the case of W-CDMA, LTE, and the like. At this time, TX_MOD_SIG scarcely leaks to the receiving side (input of LNAa (LNAb)), since the frequency of TX_MOD_SIG is included in a block band of a receiving band-pass filter BPF in DPX. However, the above spurious SPUR can leak to the receiving side, since sometimes the frequency of TX_MOD_SIG is included in a pass band of the DPX (BPF).

Figure 15:
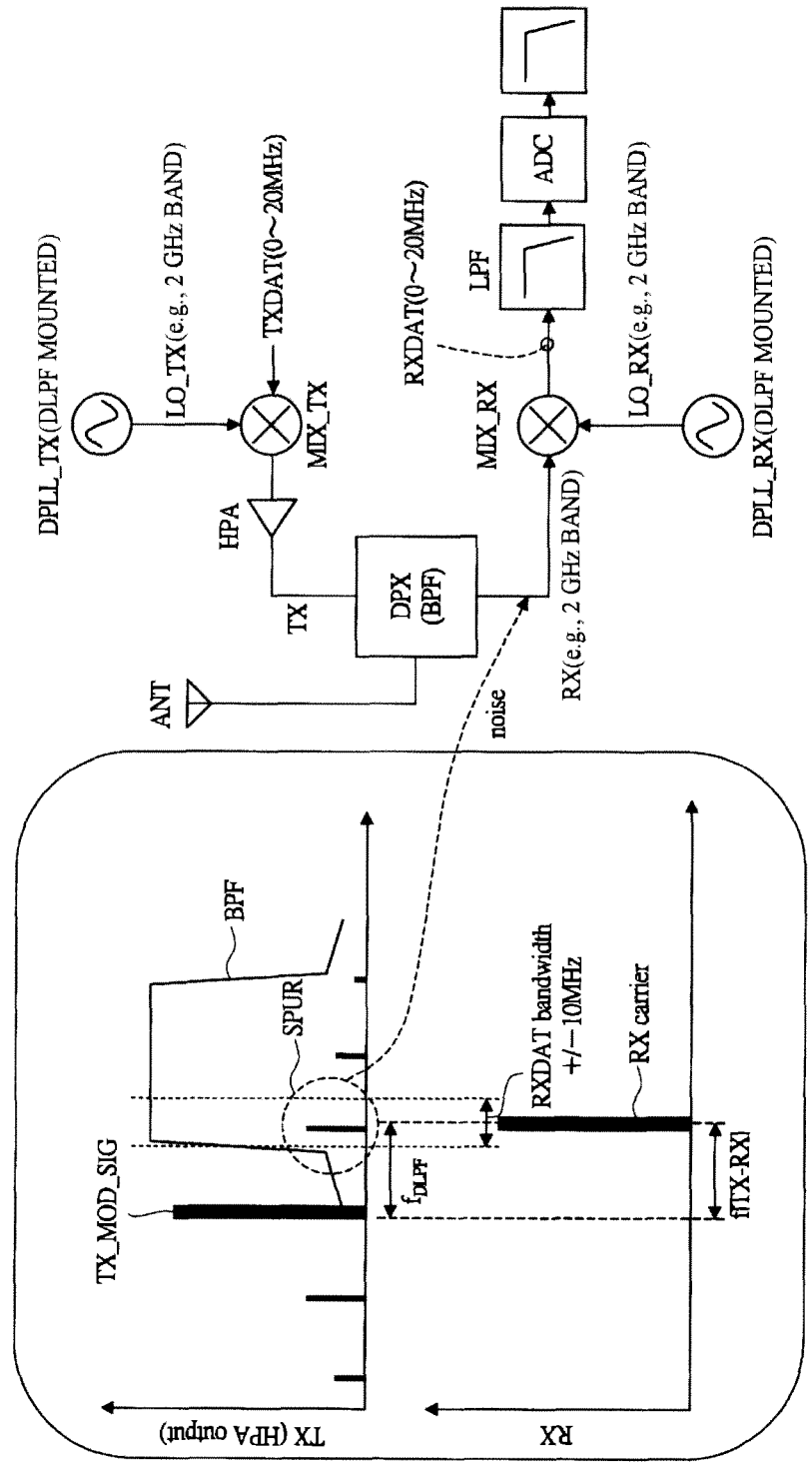
FIG. 15 is an explanatory diagram showing a mechanism of causing a spurious problem in a wireless communication system examined as the premise of the present invention.

In FIG. 5, differently from the case of FIG. 15, the DLPF clock frequency $f_{DLPF}$ in DPLL_TX is set so that this SPUR does not overlap with the desired frequencies of the receiving power signal RX (signal band centering the receiving carrier frequency). Therefore, it becomes possible to obtain the correct analog baseband signal RXDAT based on RX in the output of MIX_RXa (MIX_RXb) of FIG. 1. LPFa (LPFb) can eliminate a noise component caused by this leakage.

FIG. 6 is a conceptual diagram showing another typical feature and effect of the high-frequency signal processing device according to an embodiment of the present invention. FIG. 6 expresses a method for solving the above problem in FIG. 16. In FIG. 6, differently from FIG. 5, the problem is the case in which the transmission modulation signal TX_MOD_SIG (e.g., corresponding to the output of MIX_TX1 of FIG. 1) is coupled to the input of the receiving mixer circuit MIX_RXa (MIX_RXb) by coupling without via the duplexer DPX. Such coupling can occur via a power source wiring or a signal wiring within RFIC of FIG. 1. Furthermore, in some cases, the coupling can occur even outside RFIC of FIG. 1 (e.g., over a wiring substrate mounting the RFIC). In particular, there is a higher possibility that such a coupling occurs as miniaturization of a semiconductor chip (or downsizing of a wireless communication system) progresses and a circuit scale of a semiconductor chip (or number of components in a wireless communication system) increases.

As shown in FIG. 6, in addition to the receiving carrier frequency component, the spurious SPUR caused at a position apart from the receiving carrier by $\pm M \times f_{DLPF}$ (M=1, 2, 3, ...) is included in the local signal LO_RX output from DPLL_RX as described in FIG. 4. Meanwhile, the transmission modulation signal TX_MOD_SIG has a predetermined signal band (e.g., ±10 Mhz in the case of LTE) centering the transmission carrier frequency in accordance with the data amount of transmission analog baseband signal TXDAT. When the frequency of SPUR and the frequencies of TX_MOD_SIG (signal band centering the transmission carrier frequency) overlap with each other, the problem caused by the coupling can occur as described in FIG. 16.

Figure 16:
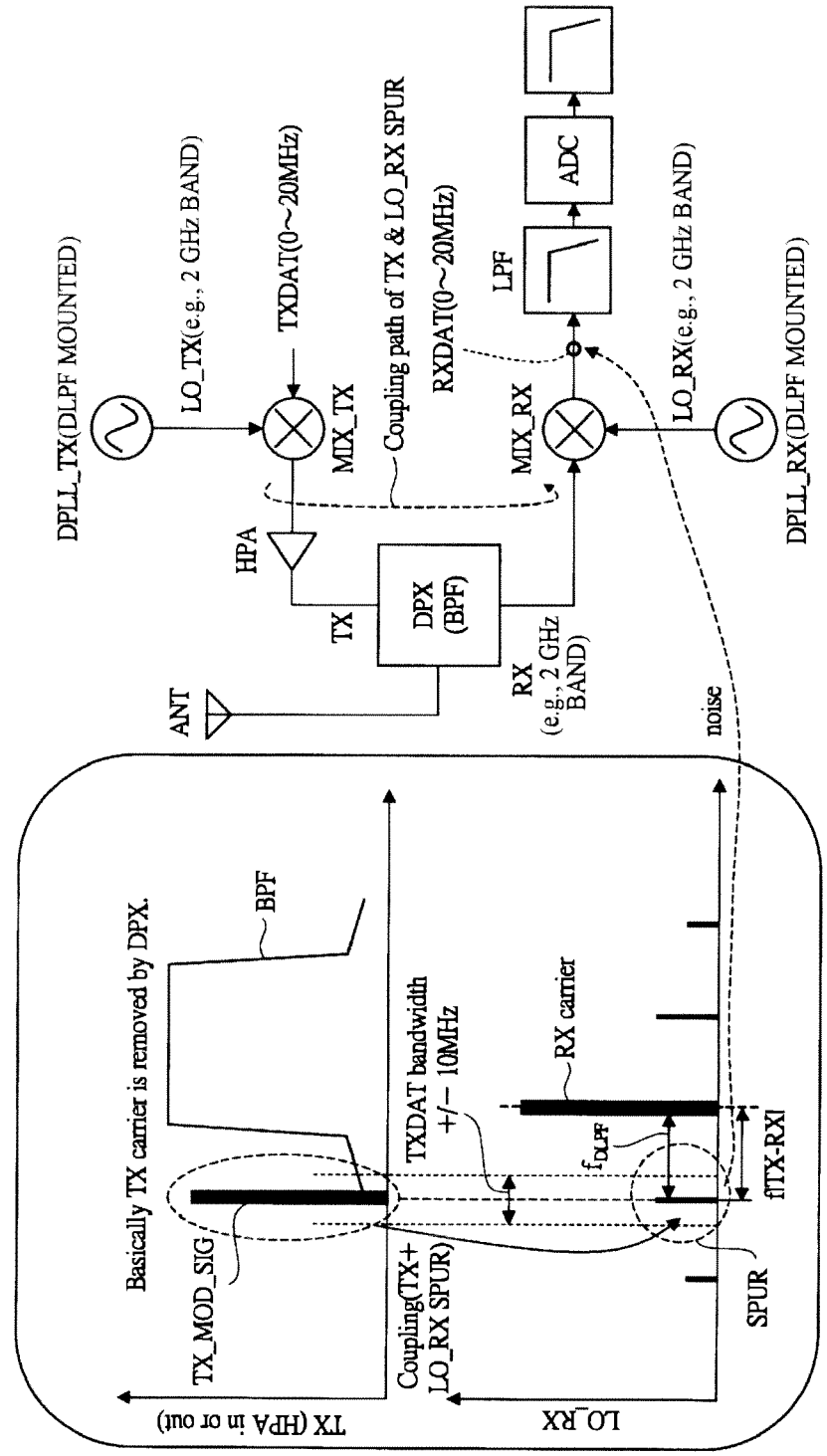
FIG. 16 is an explanatory diagram showing a mechanism different from that of FIG. 15.

In FIG. 6, differently from the case of FIG. 16, the DLPF clock frequency $f_{DLPF}$ in DPLL_RX is set so that this SPUR does not to overlap with the frequencies of TX_MOD_SIG. Therefore, even when the coupling occurs, it becomes possible to obtain the correct analog baseband signal RXDAT based on the receiving power signal RX in the output of MIX_RXa (MIX_RXb) of FIG. 1. LPFa (LPFb) can eliminate a noise component caused by this coupling.

Figure 7B:
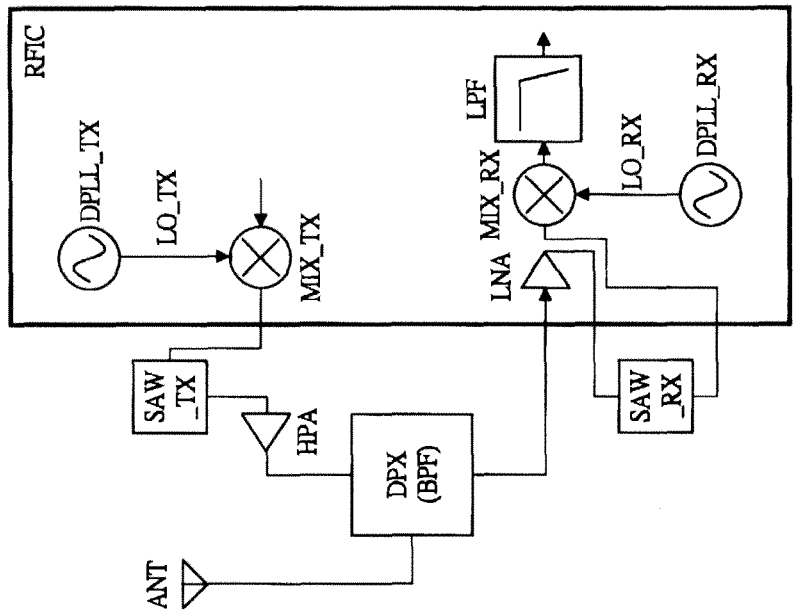
FIG. 7B is a block diagram showing a comparison of FIG. 7A.
Figure 7A:
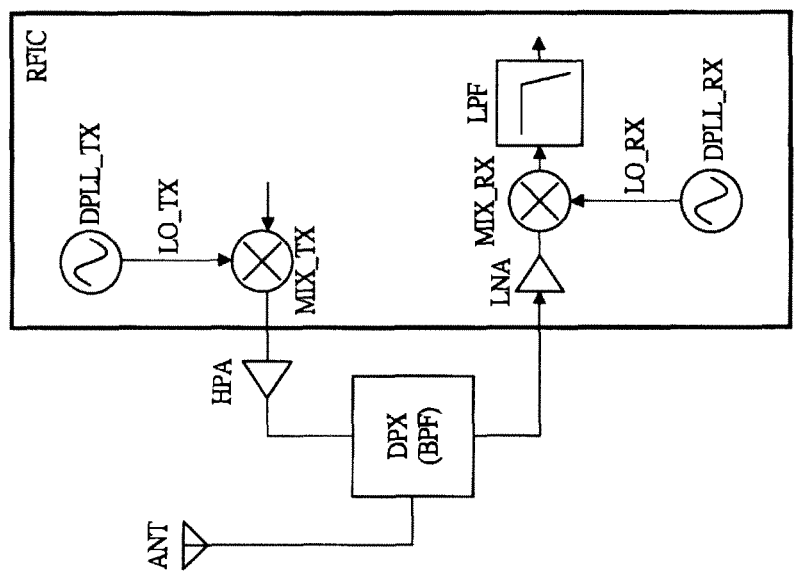
FIG. 7A is a block diagram showing a configuration of a major part in a high-frequency signal processing device according to an embodiment of the present invention.

By determining the clock frequency $f_{DLPF}$ of the digital low-pass filter DLPF by the methods described in FIG. 5 and in FIG. 6, representatively it becomes possible to reduce the influence of the spurious. Furthermore, it is possible to eliminate a SAW (Surface Acoustic Wave) filter and the like and to contribute to downsizing of a wireless communication system and cost reduction. FIG. 7A is a block diagram showing a schematic configuration for a major part of the wireless communication system according to an embodiment of the present invention and FIG. 7B is a block diagram showing a comparison of FIG. 7A.

For solving the above problem in FIG. 15, it can be considered that a transmission SAW filter SAW_TX is provided at the pre-stage of the power amplifier circuit and a receiving SAW filter SAW_RX is provided between the output of the low-noise amplifier circuit LNA and the input of the mixer circuit MIX_RX, in the outside part of the high-frequency signal processing device RFIC. SAW_TX selectively causes only the desired band to pass for the transmission modulation signal TX_MOD_SIG shown in FIG. 15 and SAW_RX selectively causes only the desired band to pass for the receiving power signal RX shown in FIG. 15. Although similar operation is performed obviously by the duplexer DPX, satisfactory characteristics are not obtained only by DPX for an attenuation slope expressing a slope of filter characteristics in a transition range and there is a problem in which the spurious SPUR leaks to the receiving side as shown in FIG. 15.

Accordingly, when SAW_TX and SAW_RX are used, the shortage of the filter characteristics of DPX can be compensated for and the SAW filter has comparatively excellent filter characteristics, and thus it becomes possible to solve a problem as shown in FIG. 15. However, the SAW filter has a comparatively high component cost and needs a large mounting area, and thus there is a problem of blocking downsizing and cost reduction for a wireless communication system. Furthermore, even if the SAW filter is used, a problem as shown in FIG. 16 sometimes cannot be solved. Accordingly, when the above method of the present embodiment is used, as shown in FIG. 7A, the problems in FIG. 15 and FIG. 16 can be solved even without using the SAW filter and this becomes beneficial from the viewpoint of downsizing and cost reduction for a wireless communication system.

<<Clock Frequency Allocating Method of the Digital Low-Pass Filter>>Next, explanation will be provided of how to specifically allocate the clock frequency $f_{DLPF}$ of the digital low-pass filter DLPF with respect to each frequency band (band) the wireless communication system of FIG. 1 supports. FIG. 8 is an explanatory diagram showing standard information of each band the wireless communication system of FIG. 1 supports. FIGS. 9A and 9B show a relationship among each band, an oscillation frequency band to be set to the digital type PLL circuit, and a clock frequency of the digital low-pass filter, where FIG. 9A is an explanatory diagram for the transmission digital type PLL circuit and FIG. 9B is an explanatory diagram for the receiving digital type PLL circuit.

FIG. 9A shows an oscillation frequency band to be actually set to DPLL_TX for each transmission band and a clock frequency $f_{DLPF}$ to be actually set to DLPF in DPLL_TX for each transmission band, in the transmission digital type PLL circuit DPLL_TX of FIG. 1. Similarly, FIG. 9B shows an oscillation frequency band to be actually set to DPLL_RX for each receiving band and a clock frequency $f_{DLPF}$ actually to be set to DLPF in DPLL_RX for each receiving band, in the receiving digital type PLL circuit DPLL_RX of FIG. 1.

As shown in FIG. 8, the wireless communication system of FIG. 1 complies with W-CDMA and LTE standard bands 1 to 13, 17 to 21, 38, and 40, the GSM 850 standard, the GSM 900 standard, the DSC 1800 standard, and the PCS 1900 standard. In the W-CDMA and LTE standard band 1, the transmission band is defined as 1,920 MHz to 1,980 MHz and the receiving band is defined as 2,110 MHz and 2,170 MHz, and the gap between the transmission band and the receiving band (f|TX−RX|) is defined as 190 MHz. While, in actual communication, specific frequencies based on channel designation from a base station are selected as the transmission carrier frequency and the receiving carrier frequency in the transmission band and the receiving band, even in this case, the gap between the transmission carrier frequency and the receiving carrier frequency is maintained so as to be 190 MHz.

When this W-CDMA and LTE standard band 1 is selected, a transmission oscillation frequency band 3, 840 MHz to 3,960 MHz is set to DPLL_TX as shown in FIG. 9A, and a receiving oscillation frequency band of 4,220 MHz to 4,340 MHz is set to DPLL_RX as shown in FIG. 9B. The transmission oscillation frequency band of 3,840 MHz to 3,960 MHz is actually divided by a ½ frequency divider (not shown in the drawing) provided between DPLL_TX and MIX_TX1 in FIG. 1 and resultantly a net oscillation frequency band becomes 1,920 MHz to 1,980 MHz. Similarly, the receiving oscillation frequency band of 4,220 MHz to 4,340 MHz is divided by a ½ frequency divider (not shown in the drawing) provided at the output of DPLL_RX in FIG. 1 and resultantly a net oscillation frequency band becomes 2,110 MHz to 2,170 MHz.

Then, the specific transmission carrier frequency and receiving carrier frequency based on the above channel designation are selected in these transmission and receiving actual oscillation frequency bands. The frequency divider is not limited to the ½ frequency divider and is optimized approximately by a relationship between the standard band and the oscillation frequency band of the digital control oscillator circuit DCO as a ¼ frequency divider is used for band 5. Furthermore, while one DPLL_TX is provided on the transmission side in FIG. 1, since the setting range of DPLL_TX extends widely as 1,648 MHz of GSM 850 to 5,851.6 MHz of band 21 as shown in FIG. 8, it is possible to provide plural DPLL_TX and to narrow the respective individual setting ranges. This is the same for the receiving side DPLL_RX.

In FIG. 9A, the clock frequency $f_{DLPF}$ of DLPF in DPLL_TX is set to 78 MHz for band 1, set to 52 MHz for band 2, and set to 78 MHz for band 3. Meanwhile, as shown in FIG. 9B, the clock frequency $f_{DLPF}$ of DLPF in DPLL_RX is set to 78 MHz for band 1 as on the transmission side, set to 52 MHz for band 2 also as on the transmission side, and set to 78 MHz for band 3 also as on the transmission side. In this manner, it is a major feature of the present embodiment to appropriately use the clock frequency $f_{DLPF}$ of DLPF selectively in accordance with the band in W-CDMA and LTE. The clock frequency $f_{DLPF}$ of 104 MHz shown in FIG. 2 is used also on the receiving side of GSM 850. In GSM (DCS or PCS), a TDD method is used, and thus the problems described in FIG. 15 and FIG. 16 hardly occur and the value of $f_{DLPF}$ may be determined appropriately in accordance with various needs.

For band 1 as an example, the reason why the clock frequency $f_{DLPF}$ of DLPF is determined to be 78 MHz will be explained. First, the case in which the spurious SPUR on the transmission side leaks to the receiving side via the duplexer DPX as described in FIG. 15 and FIG. 5 is examined. In FIG. 2, the frequency of the reference clock signal Fref is denoted by $f_{REF}$ (=26 MHz), a transmission channel frequency is denoted by $f_{TX}$, a receiving channel frequency is denoted by $f_{RX}$, and a signal band is denoted by $f_{BW}$ (maximum 20 MHz). Since the digital type PLL circuit DPLL is a synchronous circuit, $f_{DLPF}$ can have a value of formula (1). At this time, the frequency $f_{SPUR}$ of the spurious SPUR which is caused by DLPF and generated in the transmission power signal TX can be expressed by formula (2) as described also in FIG. 4.

$$f_{DLPF}=K \times f_{REF}(K=1,2,3,\ldots) \quad (1)$$

$$f_{SPUR}=f_{TX}+J \times f_{DLPF}(J=+/-1,+/-2,\ldots) \quad (2)$$

A condition in which this spurious SPUR passes through the duplexer DPX and overlaps desired frequencies of the receiving power signal RX (signal band centering the receiving carrier frequency) (i.e., condition in which the problem occurs) is expressed by formula (3). When formula (2) and formula (1) are reflected to formula (3) and specific numerical values are assigned to $f_{BW}$ and $f_{REF}$, formula (4) is obtained.

$$f_{RX}-f_{BW}/2 \leq f_{SPUR} \leq f_{RX}+f_{BW}/2 \quad (3)$$

$$(f_{RX}-f_{TX})-10 \text{ MHz} \leq J \times K \times 26 \text{ MHz} \leq (f_{RX}-f_{TX})+10 \text{ MHz} \quad (4)$$

Next, the case in which the spurious SPUR on the receiving side and the transmission modulation signal TX_MOD_SIG are coupled to each other as described in FIG. 16 and FIG. 6 is examined. At this time, the frequency $f_{SPUR}$ of the spurious SPUR which is caused by DLPF and generated in the receiving local signal LO_RX can be expressed by formula (5) as described in FIG. 4.

$$f_{SPUR}=f_{RX}+J' \times f_{DLPF}(J'=+/-1,+/-2,\ldots) \quad (5)$$

When this spurious SPUR is mixed with TX_MOD_SIG, the frequency component of formula (6) $f_{NOISE}$ may overlap the receiving analog baseband signal RXDAT of FIG. 1 as noise.

$$f_{NOISE}=f_{TX}-f_{SPUR} \quad (6)$$

A condition in which this noise overlaps the signal band of RXDAT (condition in which the problem occurs) is expressed by formula (7), and when formula (5) and formula (1) are reflected to formula (7) and specific numerical values are assigned to $f_{BW}$ and $f_{REF}$, formula (8) is obtained.

$$-f_{BW}/2 \leq f_{NOISE} \leq f_{BW}/2 \quad (7)$$

$$-10 \text{ MHz} \leq (f_{TX}-f_{RX})-J' \times K \times 26 \text{ MHz} \leq 10 \text{ MHz} \quad (8)$$

Here, formula (4) and formula (8) are equivalent to each other and the gap $(f_{RX}-f_{TX})$ between the receiving carrier frequency and the transmission carrier frequency in formula (4) is a fixed value for each band as shown by |fTX−RX| in FIG. 8, and thus the value of $f_{DLPF}$ (=K×26 MHz) may be determined so as to avoid the range of formula (4) for all the "J" values.

Figure 10:
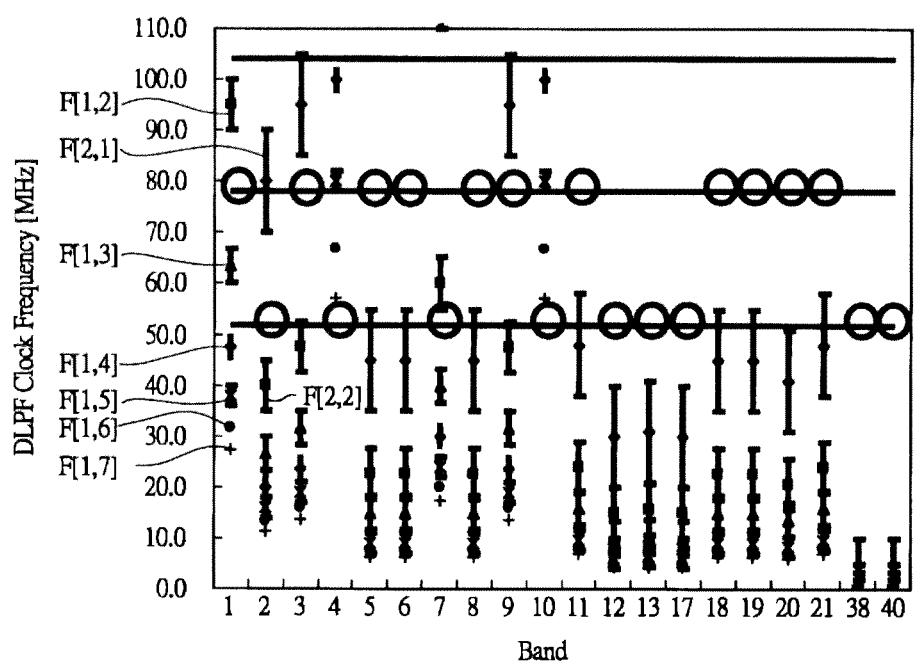
FIG. 10 is an explanatory diagram showing a clock frequency range of a digital low-pass filter where a spurious problem can be caused in each band of W-CDMA and LTE and a clock frequency to be allocated in consideration of this range.

FIG. 10 is an explanatory diagram showing a clock frequency range of the digital low-pass filter where the spurious problem may occur for each band of WCDMA and LTE and a clock frequency allocated in consideration of this range, in the wireless communication system of FIG. 1. In the case of band 1, as shown in FIG. 8, the gap between the receiving carrier frequency and the transmission carrier frequency $(f_{RX}-f_{TX})$ (i.e., f|TX−RX|) becomes 190 MHz. In this case, a $f_{DLPF}$ (=K×26 MHz) range where the spurious problem occurs becomes 180 MHz≤$f_{DLPF}$≤200 MHz (omitted from FIG. 10) for J=1 (first order spurious) on a basis of the above formula (4). Similarly, the above range becomes 90 MHz≤$f_{DLPF}$≤100 MHz (F[1,2] of FIG. 10) for J=2 (second order spurious), 60 MHz≤$f_{DLPF}$≤67 MHz (F[1,3] of FIG. 10) for J=3 (third order spurious), and 45 MHz≤$f_{DLPF}$≤50 MHz (F[1,4] of FIG. 10) for J=4 (fourth order spurious).

Subsequently, F[1,P] is obtained similarly for J=P (Pth order spurious), and F[B, 1] to F[B,P] are obtained similarly for another band B. As apparent from FIG. 10, if the clock frequency $f_{DLPF}$ of DLPF is sufficiently high (e.g., sufficiently higher than 200 MHz for the example of band 1), it is possible to easily avoid the range where the spurious problem occurs. However, when $f_{DLPF}$ is made high, it becomes difficult to make a synchronous design of the digital type PLL circuit DPLL (e.g., set-up violation occurs), and a demerit of consumption current increase is caused. Accordingly, it is preferable to set $f_{DLPF}$ to a value as low as possible (i.e., minimum K value) in the range where the spurious problem does not occur.

Accordingly, in band 1, first in the case of $f_{DLPF}$=26 MHz (K=1), when the seventh order spurious (F[1,7]) and the eighth order or higher order spurious which is omitted from FIG. 10 is considered, this frequency falls in the range where the spurious problem occurs. Next, in the case of $f_{DLPF}$=52 MHz (K=2), this frequency is close to F[1,4] (45 MHz≤$f_{DLPF}$≤50 MHz) of FIG. 10 and is not preferable in consideration of a margin. Subsequently, in the case of $f_{DLPF}$=78 MHz (K=3), this frequency has an enough margin for F[1,2] (90 MHz≤$f_{DLPF}$≤100 MHz) of FIGS. 10 and F[1,3] (60 MHz≤$f_{DLPF}$≤67 MHz) of FIG. 10. Accordingly, in band 1, $f_{DLPF}$ is determined as $f_{DLPF}$=78 MHz as indicated by ○-mark in FIG. 10. For other bands, each $f_{DLPF}$ f is determined similarly to have a value indicated by ○-mark in FIG. 10.

Figure 11:
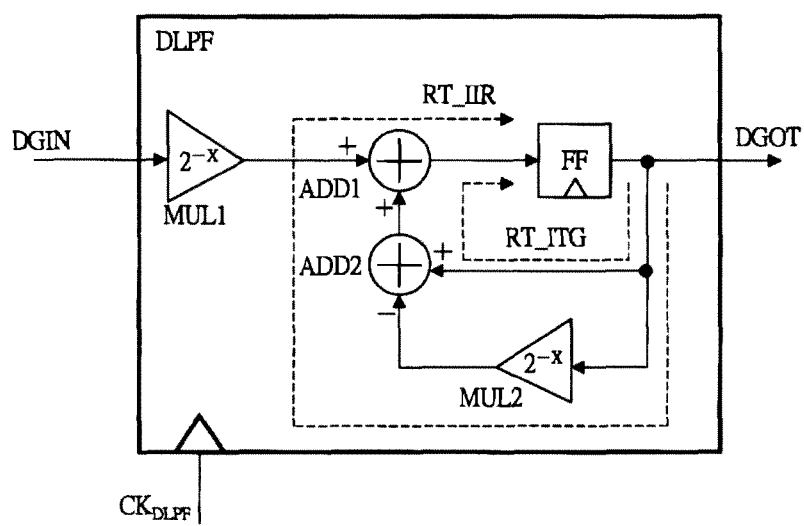
FIG. 11 is a circuit block diagram showing an outline configuration of the digital low-pass filter in the digital type PLL circuit of FIG. 2.

<<Details of the Digital Low-Pass Filter>>FIG. 11 is a circuit block diagram showing a schematic configuration example of the digital low-pass filter in the digital type PLL circuit of FIG. 2. The digital low-pass filter shown in FIG. 11 is provided with a latch circuit FF, adders (subtractors) ADD1 and ADD2, and multipliers MUL1 and MUL2. MUL1 multiplies a digital code DGIN to be input to DLPF by $2^{-x}$ X is called a filter coefficient or the like. MUL2 multiplies a digital code DGOT to be output from DLPF by $2^{-x}$. ADD2 subtracts the output of MUL2 from DGOT. ADD1 adds the output of MUL1 and the output of ADD2. FF performs latch operation for the output of ADD1 in synchronization with the clock signal $K_{DLPF}$ having the clock frequency $f_{DLPF}$ and outputs DGOT.

In this manner, DLPF of FIG. 11 mainly includes a multiplication route RT_ITG of FF→ADD2→ADD1→FF and an IIR (Infinite Impulse Response) route RT_IIR of FF→MUL2→ADD2→ADD1→FF, and thus performs averaging processing of DGIN. The configuration of the digital low-pass filter is not limited to a configuration as shown in FIG. 11 and, as widely known, can be realized by various forms such as the combination of FIR (Finite Impulse Response) filters and the use of a higher order IIR filter.

Figure 12:
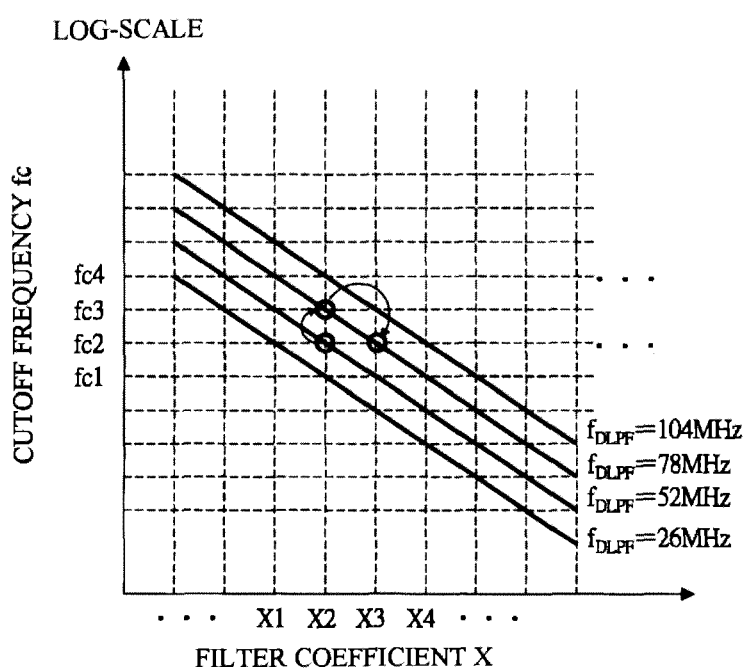
FIG. 12 is an explanatory diagram showing characteristics of the digital low-pass filter of FIG. 11 and another function of the digital low-pass filter.

FIG. 12 is an explanatory diagram showing characteristics of the digital low-pass filter in FIG. 11 and an additional function of the digital low-pass filter. Generally, a cutoff frequency fc of a digital low-pass filter is determined by a function of the clock frequency (sampling frequency) $f_{DLPF}$ of the digital low-pass filter and the filter coefficient X. Accordingly, as shown in FIG. 12, when the filter coefficient X is defined as X=X2 and $f_{DLPF}$ is changed from 52 MHz to 78 MHz, fc is changed from fc2 to fc3. When the value of the cutoff frequency fc is changed in this manner, the digital type PLL circuit DPLL cannot maintain desired characteristics and thus it is desirable to provide a mechanism to maintain a predetermined cutoff frequency fc even if the value of $f_{DLPF}$ is changed.

Accordingly, the digital low-pass filter DLPF according to the present embodiment is provided with, as one of major features, the filter coefficients X different from one another (=X2, X3, and X4) for realizing at least a predetermined cutoff frequency (e.g., fc2) with the clock frequencies $f_{DLPF}$ different from one another (=52 MHz, 78 MHz, and 104 MHz). Therefore, even when $f_{DLPF}$ is changed from 52 MHz to 78 MHz as, it becomes possible to maintain the predetermined cutoff frequency fc2 by changing X from X2 to X3 in response to the change of $f_{DLPF}$.

The filter coefficient X can be set via the register REG by the use of the PLL setting signal PSET described in FIG. 2 or the like. A specific value of X in this case can be obtained by a calculation method of causing MCU of FIG. 1 to perform program processing using a calculation formula of the cutoff frequency fc, a method of causing a memory or the like in MCU to preliminarily store the value of X for each $f_{DLPF}$ for realizing a predetermined fc and reading out the value of X corresponding to the value of $f_{DLPF}$ to be set, or the like. When the former method is used, it becomes possible to easily respond even to a case in which the setting value of fc is desired to be changed dynamically depending on manufacturing variation, environmental change, operation situation or the like, but the processing load of MCU may become a problem when the calculation formula of fc becomes complicated. Meanwhile, when the latter method is used, while the processing load of MCU is not a problem, sometimes it is a little bit difficult to handle a case such as one in which the setting value of fc is desired to be changed. If preliminarily plural values of fc are assumed and the X value of each $f_{DLPF}$ is stored for each fc, practically it is possible to sufficiently handle the case.

Figure 13:
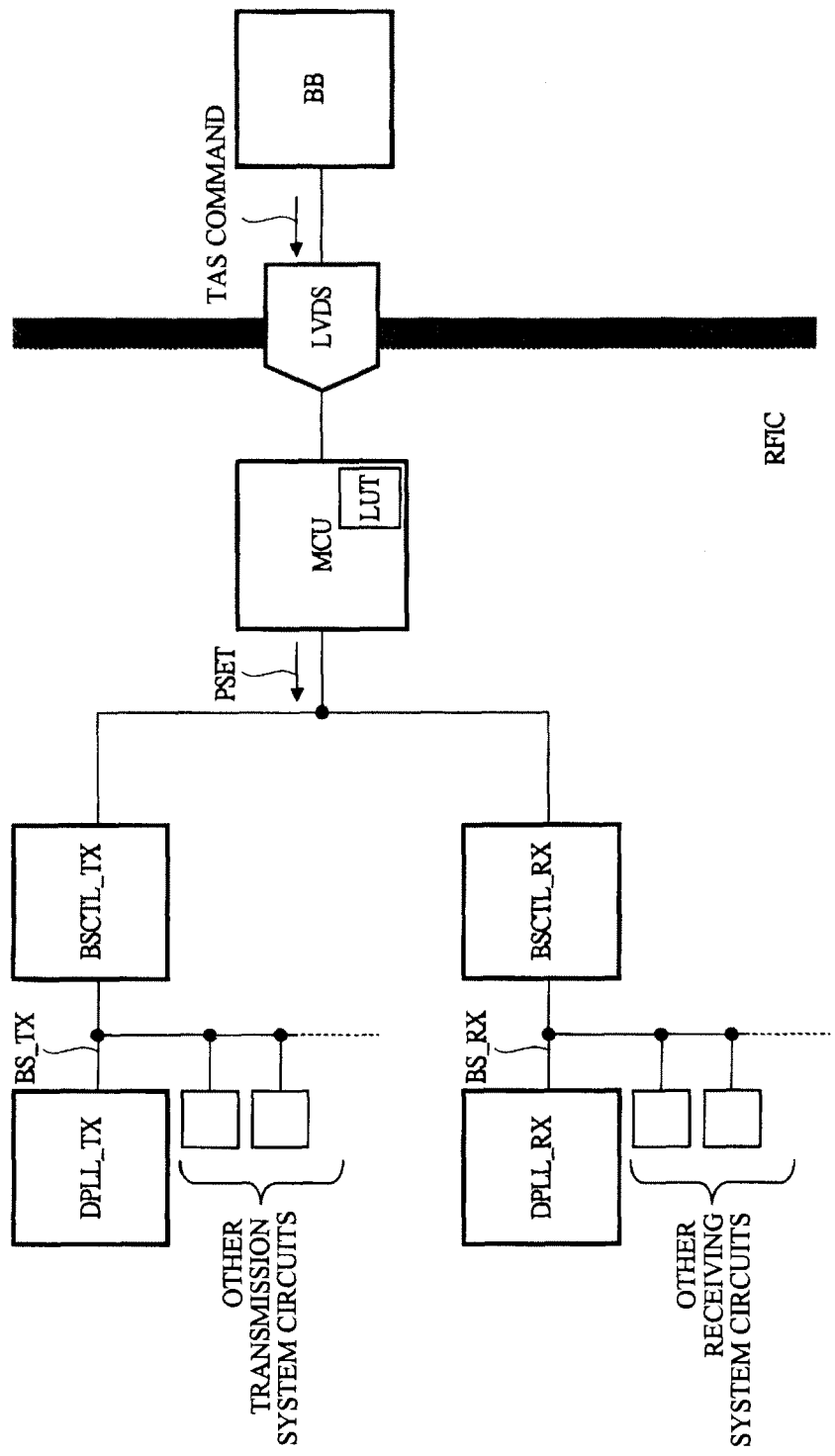
FIG. 13 is a schematic diagram of a configuration extracted with respect to setting register control of the digital type PLL circuit from the wireless communication system of FIG. 1 and FIG. 2.
Figure 14:
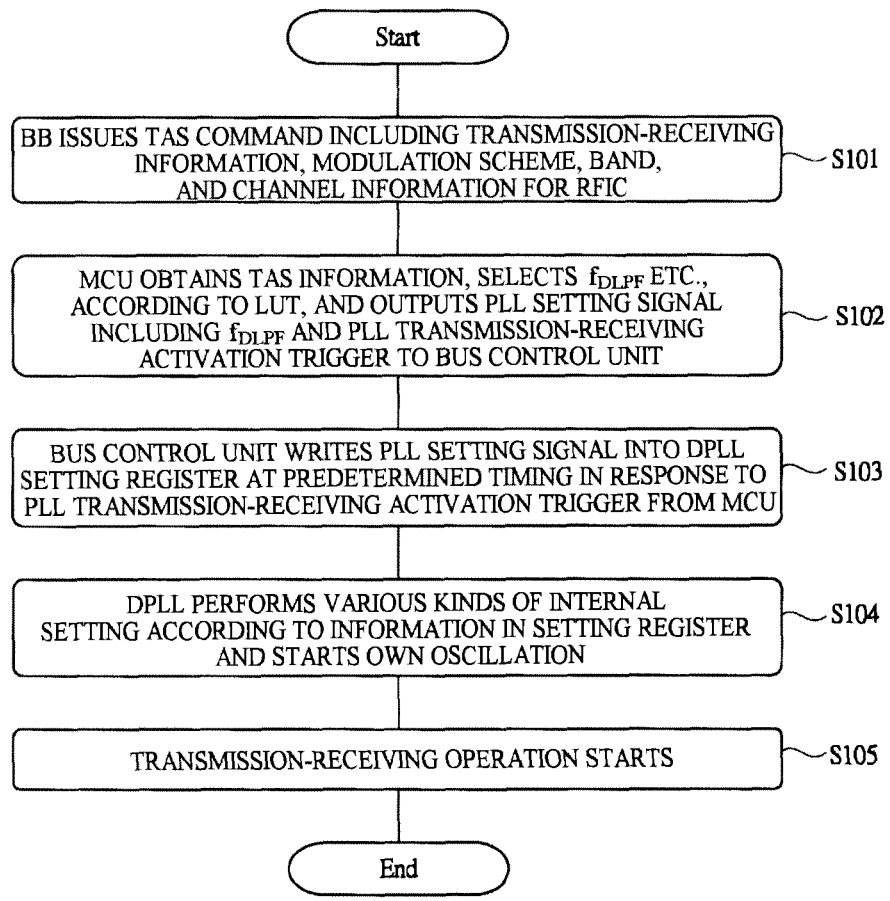
FIG. 14 is a flowchart showing processing contents in FIG. 13.

<<Control Method of the Digital Type PLL Circuit>>FIG. 13 is a schematic diagram of a configuration extracted with respect to setting register control of the digital type PLL circuit from the wireless communication system in FIG. 1 and FIG. 2. FIG. 14 is a flowchart showing processing contents in FIG. 13. FIG. 13 shows the baseband processing device BB and the microcomputer unit MCU, the transmission and receiving bus units BSCTL_TX and BSCTL_RX, and the transmission and receiving digital type PLL circuits DPLL_TX and DPLL_RX included in the high-frequency signal processing device RFIC, which are extracted from FIG. 1.

BB performs communication with MCU in RFIC via the differential interface LVDS. BSCTL_TX performs communication among DPLL_TX and the other transmission system circuits via the bus BS_TX. BSCTL_RX performs communication among DPLL_RX and the other receiving system circuits via the bus BS_RX. MCU is provided with a setting table (e.g., nonvolatile memory) LUT. In LTU, information of the clock frequency $f_{DLPF}$ of the digital low-pass filter DLPF which is allocated to each band is stored as shown in FIGS. 9A and 9B. Furthermore, values of the filter coefficient X as described in FIG. 12 are stored in LUT.

In such a configuration, when wireless communication is performed in a predetermined communication method (mode) and in a predetermined frequency band (band), as shown in FIG. 14, first BB issues a TAS command for RFIC via LVDS (S101). The TAS command includes transmission/receiving information whether either or both of transmission operation and receiving operation are performed, communication method information to be used for the transmission operation and receiving operation (W-CDMA, GSM, or the like), band information (band 1, band 2, or the like), channel information (carrier frequency information to be used in the band, and the like), and the like.

Next, MCU receives the TAS command and refers to LUT, and reads out a value of the DLPF clock frequency $f_{DLPF}$, a value of the filter coefficient X, and the like from the band information. Then, MCU outputs the PLL setting signal PSET including a setting value of the carrier frequency, a setting value of the clock frequency $f_{DLPF}$, a value of the filter coefficient X, and the like, and a PLL transmission/receiving activation trigger to BSTCTL_TX and BSCTL_RX (S102). The front-end control unit FEMCTL of FIG. 1 is notified of the transmission/receiving information via BSCTL_TX and BSCTL_RX, and the transmission/receiving information is used for selection of a connection target of the antenna switch ANTSW and the like.

Subsequently, BSCTL_TX and BSCTL_RX write the PLL setting signal PSET into the setting registers REG (FIG. 2) in DPLL_TX and DPLL_RX at a predetermined timing in response to the PLL transmission/receiving activation trigger from MCU (S103). In response to this operation, DPLL_TX (DPLL_RX) sets the transmission carrier frequency (receiving carrier frequency), the clock frequency $f_{DLPF}$, and the filter coefficient X according to the information in the setting register REG, and activates own oscillation operation (S104). After that, in a stage in which the oscillation operation is stabilized, actual wireless communication operation and/or receiving operation are/is performed (S105).

By performing various kinds of setting necessary for transmission/receiving via the buses BS_TX and BS_RX in this manner, it becomes possible to reduce the number of signal wirings for setting compared with the case without using the bus. Furthermore, by performing various kinds of setting using MCU, it becomes possible to manage the clock frequency $f_{DLPF}$, the filter coefficient X, and the like as described above in an integrated manner and to perform efficient setting.

While, hereinabove, the invention achieved by the present inventors has been explained specifically according to the embodiment, the present invention is not limited to the above embodiment and can be modified variously in a range without departing from the gist. While a mobile phone is explained as an example of a wireless communication system, the wireless communication system is not always limited to the mobile phone and the present invention can be applied similarly to a wireless LAN system accommodating plural bands (e.g., 2.4 GHz band and 5 GHz band) and the like.

The high-frequency signal processing device and the wireless communication system according to the present embodiment is effectively applied particularly to a mobile phone accommodating multiple bands and, not limited to this, can be applied widely to various kinds of wireless communication equipment.

What is claimed is:

1. A high-frequency signal processing device, comprising:
a digital phase comparator unit inputting a feedback oscillation signal and a reference oscillation signal having a reference frequency, detecting a phase difference between the reference oscillation signal and the feedback oscillation signal, and also outputting a first digital signal representing the phase difference;
a digital filter unit performing averaging processing on the first digital signal in synchronization with a first clock signal and outputting the processing result as a second digital signal;
a digital control oscillator unit including an inductance element and plural capacitance elements each coupled to an oscillator node and outputting a carrier oscillation signal at the oscillator node by coupling the capacitance elements selectively to the oscillator node based on frequency setting information expressed by the second digital signal;
a frequency divider unit outputting the feedback oscillation signal and the first clock signal by dividing the carrier oscillation signal; and
a setting unit selecting a first clock frequency of the first clock signal from a plurality of options based on frequency band information of a standard to be used and controlling a frequency dividing ratio to be used in the frequency divider unit, based on the selected first clock frequency and a carrier frequency to be set among frequency bands of the standard.

2. The high-frequency signal processing device according to claim 1,
wherein, in the selection of the first clock frequency, when the first clock frequency is denoted by "F", a difference between a transmission carrier frequency and a receiving carrier frequency in the frequency band of the standard is denoted by "D", a signal band in transmission operation and receiving operation is denoted by "B", and "M" is set to be an arbitrary integer equal to or larger than one, the setting unit selects a value of "F" which is not included in an inhibited range of $((D-B)/M) \leq F \leq ((D+B)/M)$.

3. The high-frequency signal processing device according to claim 2,
wherein, in the selection of the first clock frequency, the setting unit further selects a minimum value among values each of which has a predetermined margin for the inhibited range and also is a value of N times the reference frequency (N is an integer equal to or larger than one).

4. The high-frequency signal processing device according to claim 1,
wherein the first clock frequency has a value of N times the reference frequency (N is an integer equal to or larger than one).

5. The high-frequency signal processing device according to claim 4,
wherein the setting unit further includes:
a storage unit retaining a first filter coefficient realizing a predetermined cutoff frequency in the digital filter unit through the use of one of the first clock frequencies the first clock signal can take, and
a second filter coefficient realizing the predetermined cutoff frequency through the use of another one of the first clock frequencies.

6. The high-frequency signal processing device according to claim 4,
wherein the frequency divider unit includes:
a prescaler circuit performing frequency dividing of the carrier oscillation signal at any of a plurality of predetermined first frequency dividing ratios;
a first frequency divider circuit performing frequency dividing of an output signal of the prescaler circuit at a second frequency dividing ratio based on a first control value from the setting unit, while switching the first frequency dividing ratios of the prescaler circuit, and outputting the feedback oscillation signal; and
a second frequency divider circuit performing frequency dividing of the output of the prescaler circuit at a third frequency dividing ratio based on a second control value from the setting unit, and outputting the first clock signal.

7. The high-frequency signal processing device according to claim 6,
wherein the setting unit includes:
a control unit selecting the first clock frequency and outputting information of the selected first clock frequency and information of the carrier frequency;
a setting register retaining the information of the first clock frequency and the information of the carrier frequency which are output from the control unit; and
a sigma-delta modulation circuit changing the first control value dynamically on a time sequence based on the information of the carrier frequency in the setting register and realizing a value including a decimal point as a setting frequency dividing ratio which is a ratio of the carrier frequency and the reference frequency, in the first frequency divider circuit.

8. The high-frequency signal processing device according to claim 7,
wherein the first control value includes a first count value corresponding to the second frequency dividing ratio,
wherein the second frequency divider circuit generates the first clock signal by mixing, at a first frequency, a high-level signal or a low-level signal having a period obtained by counting the number of the output signals of the prescaler circuit through the use of a second count value and a high-level signal or a low-level signal having a period obtained by counting the number of the output signals of the prescaler circuit through the use of a third count value different from the second count value by one, and
wherein the sigma-delta modulation circuit further calculates the second count value and the first frequency so that a total count value for the high-level signal and the low-level signal coincides with the first count value, based on the first count value and the information of the first clock frequency in the setting register, and outputs the calculation result as a second control value.

9. The high-frequency signal processing device according to claim 7, further comprising:
a transmission mixer circuit performing up-conversion of a transmission signal in a baseband into a predetermined transmission frequency band through the use of a transmission carrier signal;

a receiving mixer circuit performing down-conversion of a receiving signal having a predetermined receiving frequency band into a baseband through the use of a receiving carrier signal;

a transmission PLL circuit including the digital phase comparator unit, the digital filter unit, the digital control oscillator unit, the frequency divider unit, the setting register, and the sigma-delta modulation circuit, and generating the transmission carrier signal as the carrier oscillation signal, and a receiving PLL circuit including the digital phase comparator unit, the digital filter unit, the digital control oscillator unit, the frequency divider unit, the setting register, and the sigma-delta modulation circuit, and generating the receiving carrier signal as the carrier oscillation signal.

10. A wireless communication system, comprising:

a transmission mixer circuit performing up-conversion of a transmission signal in a baseband into a predetermined transmission frequency band through the use of a transmission carrier signal;

a transmission PLL circuit outputting the transmission carrier signal;

a power amplifier circuit being provided at a post-stage of the transmission mixer circuit and amplifying the transmission signal in a predetermined gain;

a receiving mixer circuit performing down-conversion of a receiving signal having a predetermined receiving frequency band into a baseband through the use of a receiving carrier signal;

a receiving PLL circuit outputting the receiving carrier signal;

an antenna; and a duplexer being provided between a post-stage of the power amplifier circuit and the antenna and also between a pre-stage of the receiving mixer circuit and the antenna, performing transmission to the antenna by selecting a predetermined frequency band in the transmission signal, and performing transmission to the receiving mixer circuit by selecting a predetermined frequency band in the receiving signal received by the antenna, and each of the transmission PLL circuit and the receiving PLL circuit, comprising:

a digital phase comparator unit inputting a feedback oscillation signal and a reference oscillation signal having a predetermined reference frequency, detecting a phase difference between the reference oscillation signal and the feedback oscillation signal, and also outputting a first digital signal representing the phase difference;

a digital filter unit performing averaging processing on the first digital signal in synchronization with a first clock signal and outputting the processing result as a second digital signal;

a digital control oscillator unit including an inductance element and plural capacitance elements each coupled to an oscillator node and outputting a carrier oscillation signal which serves as the transmission carrier signal or the receiving carrier signal, at the oscillator node by coupling the capacitance elements selectively to the oscillator node based on frequency setting information expressed by the second digital signal;

a frequency divider unit outputting the feedback oscillation signal and the first clock signal by dividing the carrier oscillation signal; and a setting unit selecting a first clock frequency of the first clock signal from a plurality of options based on frequency band information of a standard to be used and controlling a frequency dividing ratio to be used in the frequency divider unit, based on the selected first clock frequency and a carrier frequency to be set among frequency bands of the standard.

11. The wireless communication system according to claim 10, wherein, in the selection of the first clock frequency, when the first clock frequency is denoted by "F", a difference between a transmission carrier frequency and a receiving carrier frequency in the frequency band of the standard is denoted by "D", a signal band in transmission operation and receiving operation is denoted by "B", and "M" is set to be an arbitrary integer equal to or larger than one, the setting unit selects a value of "F" which is not included in an inhibited range of $((D-B)/M) \leq F \leq ((D+B)/M)$.

12. The wireless communication system according to claim 11, wherein, in the selection of the first clock frequency, the setting unit further selects a minimum value among values each of which has a predetermined margin for the inhibited range and is a value of N times the reference frequency (N is an integer equal to or larger than one).

13. The wireless communication system according to claim 12, wherein the frequency band of the standard is a frequency band defined by the W-CDMA standard or the LTE standard.

14. The wireless communication system according to claim 10, wherein the first clock frequency has a value of N times the reference frequency (N is an integer equal to or larger than one).

15. The wireless communication system according to claim 14, wherein the setting unit further includes:

a storage unit retaining a first filter coefficient realizing a predetermined cutoff frequency in the digital filter unit through the use of one of the first clock frequencies the first clock signal can take, and a second filter coefficient realizing the predetermined cutoff frequency through the use of another one of the first clock frequencies.

16. The wireless communication system according to claim 14, wherein the frequency divider unit includes:

a prescaler circuit performing frequency dividing of the carrier oscillation signal at any one of a plurality of predetermined first frequency dividing ratios;

a first frequency divider circuit performing frequency dividing of an output signal of the prescaler circuit at a second frequency dividing ratio based on a first control value from the setting unit, while switching the first frequency dividing ratios of the prescaler circuit, and outputting the feedback oscillation signal; and a second frequency divider circuit performing frequency dividing of the output of the prescaler circuit at a third frequency dividing ratio based on a second control value from the setting unit, and outputting the first clock signal.

17. The wireless communication system according to claim 16, wherein the setting unit includes:

a control unit selecting the first clock frequency and outputting information of the selected first clock frequency and information of the carrier frequency;

a setting register retaining the information of the first clock frequency and the information of the carrier frequency which are output from the control unit; and a sigma-delta modulation circuit changing the first control value dynamically on a time sequence according to the information of the carrier frequency in the setting register and causing the first frequency divider circuit to realize a value including a decimal point as a setting frequency dividing ratio which is a ratio of the carrier frequency and the reference frequency.

18. The wireless communication system according to claim 17, wherein the first control value includes a first count value corresponding to the second frequency dividing ratio, wherein the second frequency divider circuit generates the first clock signal by mixing, at a first frequency, a high-level signal or a low-level signal having a period obtained by counting the number of the output signals of the prescaler circuit through the use of a second count value and a high-level signal or a low-level signal having a period obtained by counting the number of the output signals of the prescaler circuit through the use of a third count value different from the second count value by one, and wherein the sigma-delta modulation circuit calculates the second count value and the first frequency so that a total count value for the high-level signal and the low-level signal coincides with the first count value, based on the first count value and the information of the first clock frequency in the setting register, and outputs the calculation result as a second control value.

* * * * *